(12) United States Patent
Miyashita et al.

(10) Patent No.: US 7,776,660 B2
(45) Date of Patent: Aug. 17, 2010

(54) MANUFACTURING METHOD OF A SEMICONDUCTOR DEVICE

(75) Inventors: Isao Miyashita, Tokyo (JP); Yuji Fujii, Tokyo (JP); Hajime Ebara, Tokyo (JP); Katsuo Ishizaka, Tokyo (JP); Norio Hosoya, Tokyo (JP); Hidekazu Okuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 235 days.

(21) Appl. No.: 11/833,619

(22) Filed: Aug. 3, 2007

(65) Prior Publication Data

US 2008/0076238 A1 Mar. 27, 2008

(30) Foreign Application Priority Data

Sep. 27, 2006 (JP) ............................. 2006-262732

(51) Int. Cl.
*H01L 21/332* (2006.01)
(52) U.S. Cl. ................ 438/140; 438/530; 257/E21.384
(58) Field of Classification Search ......... 438/510–569, 438/140; 257/E21.384
See application file for complete search history.

(56) References Cited

U.S. PATENT DOCUMENTS

| | | | | |
|---|---|---|---|---|
| 6,365,446 | B1 * | 4/2002 | Chong et al. ................ | 438/197 |
| 6,559,023 | B2 * | 5/2003 | Otsuki et al. ................ | 438/342 |
| 6,610,572 | B1 * | 8/2003 | Takei et al. ................ | 438/268 |
| 6,621,120 | B2 * | 9/2003 | Otsuki et al. ................ | 257/327 |
| 7,420,246 | B2 * | 9/2008 | Ozoe et al. ................ | 257/330 |
| 2004/0253791 | A1 * | 12/2004 | Sun et al. ................ | 438/308 |
| 2005/0233499 | A1 * | 10/2005 | Okuda et al. ................ | 438/118 |
| 2008/0014439 | A1 * | 1/2008 | Bol ............................. | 428/337 |

FOREIGN PATENT DOCUMENTS

| | | |
|---|---|---|
| JP | 2002-314084 | 10/2002 |
| JP | 2003-59856 | 2/2003 |
| JP | 2004-140101 | * 5/2004 |

* cited by examiner

*Primary Examiner*—Chandra Chaudhari
(74) *Attorney, Agent, or Firm*—Mattingly & Malur, P.C.

(57) ABSTRACT

Provided is a technology of carrying out activation annealing of n type impurity ions implanted for the formation of a field stop layer ($n^+$ type semiconductor region) and activation annealing of p type impurity ions implanted for the formation of a collector region ($p^+$ type semiconductor region) in separate steps to adjust an activation ratio of the n type impurity ions in the field stop layer to 60% or greater and an activation ratio of the p type impurity ions in the collector region to from 1 to 15%. This makes it possible to form an IGBT having a high breakdown voltage and high-speed switching characteristics. Moreover, use of a film stack made of nickel silicide, titanium, nickel and gold films for a collector electrode makes it possible to provide an ohmic contact with the collector region.

29 Claims, 21 Drawing Sheets

MANUFACTURING METHOD OF A SEMICONDUCTOR DEVICE

CROSS-REFERENCE TO RELATED APPLICATIONS

The disclosure of Japanese Patent Application No. 2006-262732 filed on Sep. 27, 2006 including the specification, drawings and abstract is incorporated herein by reference in its entirety.

BACKGROUND OF THE INVENTION

The present invention relates to a manufacturing technology of a semiconductor device, particularly to a technology effective when applied to the manufacture of an insulated gate bipolar transistor (which will hereinafter be abbreviated as IGBT).

In Japanese Patent Laid-Open No. 2003-59856 (Paragraph [0012], FIG. 5), there is described a technology which includes implanting impurity ions into the back surface of an FZ wafer and carrying out heat treatment for activating the implanted ions by using laser annealing with pulse laser having a wavelength of from 240 to 1070 nm and a half bandwidth of from 100 to 500 nm or using, in combination, this laser annealing and low-temperature furnace annealing.

In Japanese Patent Laid-Open No. 2002-314084 (Paragraphs [0027]-[0030], FIGS. 6 to 8], there is described another technology which includes grinding a surface opposite to a surface having an emitter electrode formed thereover to a predetermined thickness; selectively washing only the ground surface; implanting, into the washed surface, phosphorus ions for the formation of a field stop layer and boron ions for the formation of a collector layer; carrying out heat treatment at a temperature of 300° C. or greater but not greater than 550° C. to form the field stop layer and the collector layer; and forming a collector electrode.

SUMMARY OF THE INVENTION

In a punch-through IGBT, a double epitaxial wafer obtained by successive epitaxial growth of an n type semiconductor layer and another n type semiconductor wafer lower in impurity concentration on a wafer made of, for example, p type CZ crystals (crystals formed by CZ (Czochralski) method) is used. A p type portion of the wafer becomes a collector region; an n type semiconductor layer thereover becomes a field stop layer; and an n type semiconductor layer thereover becomes a base region. Over the surface on the side of the base region of this double epitaxial wafer, a p type channel region, an n type emitter region, an emitter electrode, a gate insulating film, a gate electrode and the like are formed. After the whole surface of the double epitaxial wafer is annealed via electron beam irradiation in order to control the lifetime, a collector electrode is formed on the surface of the wafer on the side of the collector region.

In recent years, an IGBT (for example, Japanese Patent Laid-Open No. 2003-59856) using a double ion implantation system has been developed. In this IGBT, a field stop layer and a collector region are formed using a wafer made of, for example, n type FZ crystals (crystals grown by the FZ (floating zone) method), implanting n type impurity ions, for example, phosphorus ions, for the formation of the field stop layer from the back surface of the wafer, implanting p type impurity ions, for example, boron ions, for the formation of the collector region, and then carrying out activation annealing.

However, the production cost of the IGBT using the double epitaxial wafer is high because it uses double epitaxial crystals more expensive than FZ crystals. The double epitaxial wafer has another problem to be solved. Described specifically, since it usually employs a heavily-doped substrate as a p type substrate and therefore, needs a heavily-doped n layer over the p type substrate for hole injection control and also needs lifetime control, the lifetime of the n type base region decreases and on-voltage increases. It also has a further problem such as poor controllability of hole injection from a collector electrode due to variations in the concentration of the collector region.

The IGBT adopting the double ion implantation system, on the other hand, uses FZ crystals and does not need annealing via electron beam irradiation for the purpose of controlling the lifetime so that the production cost of it can be reduced. In this IGBT, however, activation annealing for n type impurity ions and that for p type impurity ions are carried out simultaneously so that it is difficult to realize both a high activation ratio (for example, activation ratio of 60% or greater) of n type impurity ions in the field stop layer and a low activation ratio (for example, from 1 to 15%) of p type impurity ions in the collector region. This leads to a problem that when defects due to the ion implantation for the field stop layer are eliminated fully, the IGBT cannot have high-speed switching characteristics.

An electrode having a multilayer structure containing aluminum is commonly used as a collector electrode because it provides a good ohmic contact with a p type collector region, but there is a possibility of aluminum, which has low moisture resistance, dissolving in water or the like and lowering the reliability of products using it.

An object of the present invention is to provide a technology capable of realizing an IGBT having high breakdown voltage and excellent switching characteristics.

Another object of the present invention is to provide a technology capable of realizing a highly reliable IGBT by preventing corrosion of a collector electrode.

The above-described and other objects and novel features of the present invention will be apparent from the description herein and accompanying drawings.

Outline of the typical inventions, of the inventions disclosed by the present application, will next be described.

In one aspect of the present invention, there is thus provided a manufacturing method of a semiconductor device, including the steps of: forming a semiconductor element and an interconnect on the surface side of an n type semiconductor substrate having FZ single crystal silicon; after laying a protective film over the semiconductor element and interconnect to cover them, attaching a reinforcing plate onto the protective film; grinding the semiconductor substrate from the back surface thereof; implanting n type impurity ions from the back surface side of the semiconductor substrate; irradiating laser to the region into which the n type impurity ions have been implanted to form an n$^+$ type semiconductor region having an activation ratio of the n type impurity ions of 60% or greater; implanting p type impurity ions into a region shallower than the n$^+$ type semiconductor region from the back surface side of the semiconductor substrate; irradiating laser to the region into which the p type impurity ions have been implanted to form a p$^+$ type semiconductor region having an activation ratio of the p type impurity ions of from 1 to 15%; depositing a nickel film over the back surface of the semiconductor substrate; irradiating laser to cause a reaction between the nickel film and the semiconductor substrate to form a nickel silicide film contiguous to the p$^+$ type semiconductor region; stacking a titanium film, a nickel film and a gold film successively over the nickel silicide film to form a collector electrode having a film stack structure; and peeling the reinforcing plate.

In another aspect of the present invention, there is also provided a manufacturing method of a semiconductor device, including the steps of: forming a semiconductor element and an interconnect on the surface side of an n type semiconductor substrate having FZ single crystal silicon; laying a protective film over the semiconductor element and interconnect to cover them; grinding the semiconductor substrate from the back surface thereof; implanting n type impurity ions from the back surface side of the semiconductor substrate; irradiating laser to the region into which the n type impurity ions have been implanted to form an $n^+$ type semiconductor region having an activation ratio of the n type impurity ions of 60% or greater; implanting p type impurity ions into a region shallower than the $n^+$ type semiconductor region from the back surface side of the semiconductor substrate; subjecting the semiconductor substrate to low-temperature heat treatment to form a $p^+$ type semiconductor region having an activation ratio of the p type impurity ions from 1 to 15%; forming, over the back surface of the semiconductor substrate, a first nickel film, a titanium film, a second nickel film and a gold film successively; and subjecting the semiconductor substrate to low-temperature heat treatment to cause a reaction between the first nickel film and the semiconductor substrate to form a nickel silicide film.

Advantages available by the typical inventions, of the inventions disclosed by the present application, will next be described briefly.

An IGBT having high breakdown voltage and excellent switching characteristics can be realized by using a semiconductor substrate made of FZ single crystal silicon, and carrying out activation annealing of a field stop layer and activation annealing of a collector region, respectively to attain activation ratios of impurity ions suited for the field stop layer and collector region respectively. In addition, by using a contact electrode having an aluminum-free multilayer structure (for example, a film stack obtained by stacking a nickel silicide film, a titanium film, a nickel film and a gold film one after another in the order of mention), corrosion of the contact electrode can be prevented and a highly reliable IGBT can be realized.

DETAILED DESCRIPTION OF THE INVENTION

Figure 1:
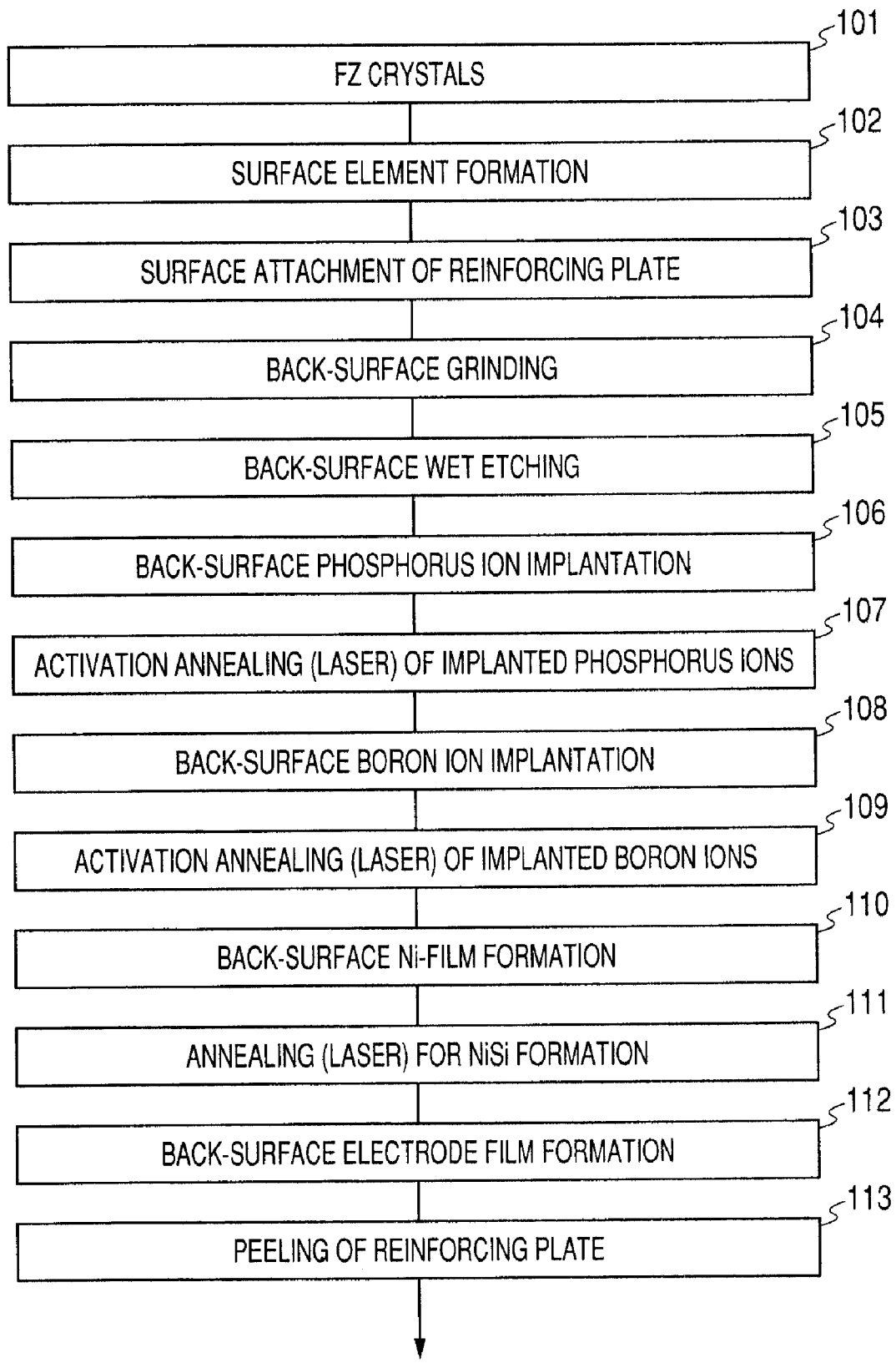
FIG. 1 is a flow chart explaining the manufacturing method of a semiconductor device according to Embodiment 1 of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range.

In all the drawings for describing the below-described embodiments, elements having like function will be identified by like reference numerals and overlapping descriptions will be omitted. The embodiments of the present invention will hereinafter be described specifically based on accompanying drawings.

Embodiment 1

Figure 9:
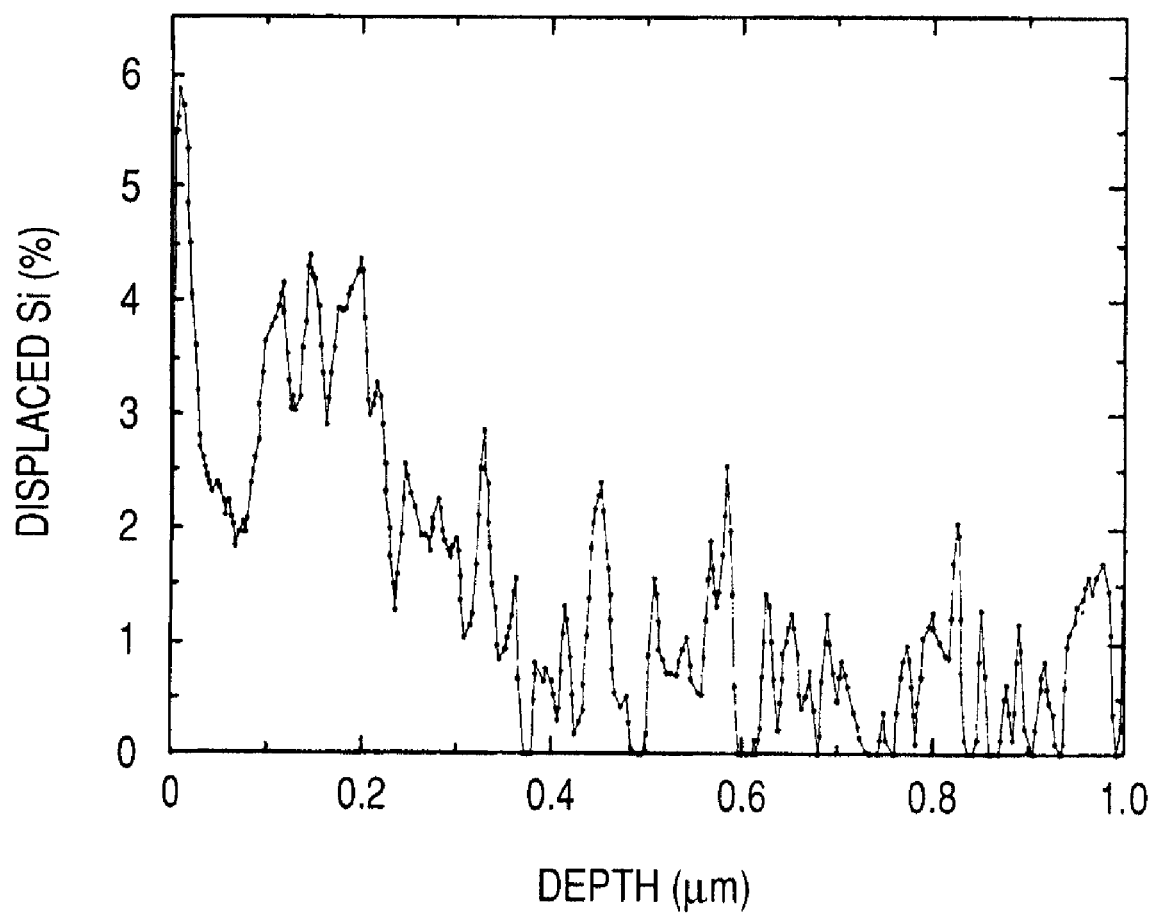
FIG. 9 is a graph showing displaced Si atoms generated by the implantation of boron ions in Embodiment 1 of the present invention.
Figure 10:
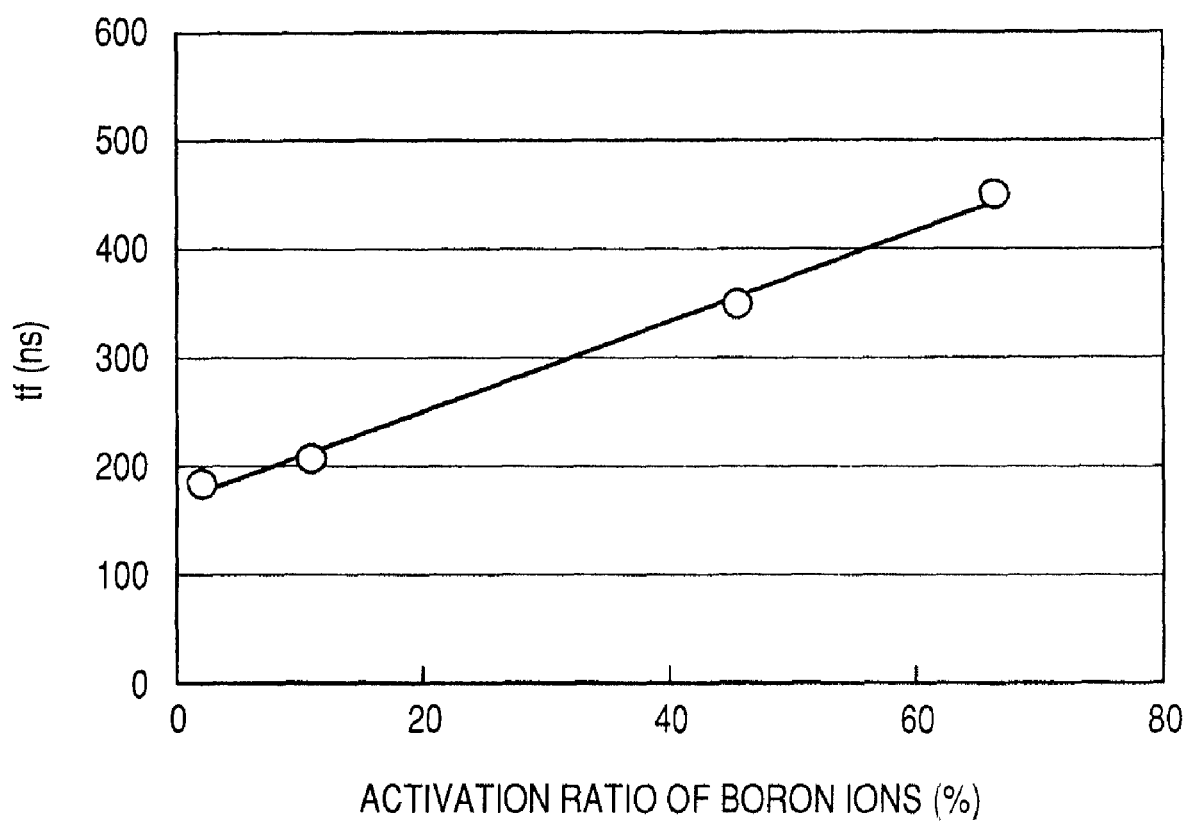
FIG. 10 is a graph showing the relationship between the switch-off time (tf) and activation ratio of boron ions in Embodiment 1 of the present invention.
Figure 11:
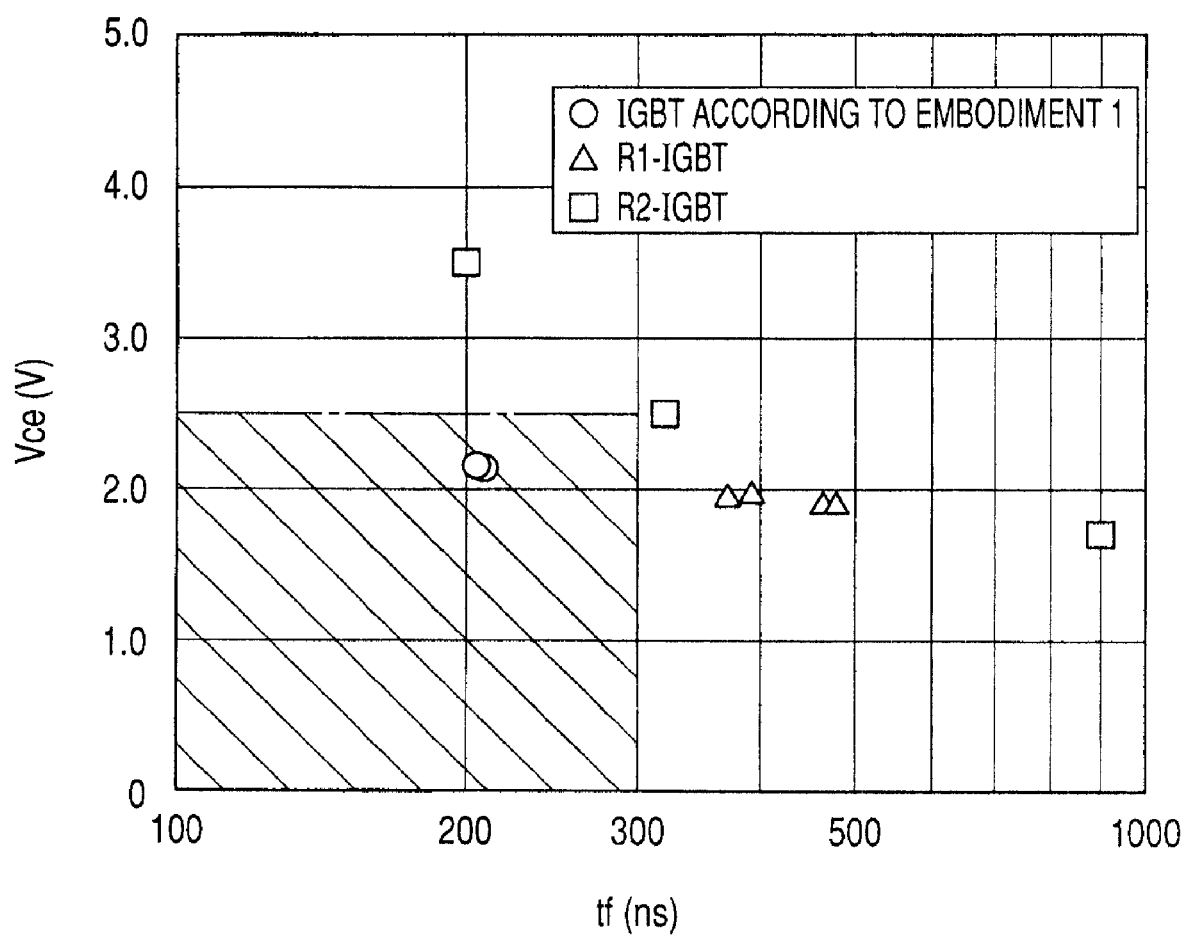
FIG. 11 is a graph showing the relationship between the on-voltage (Vce) and switch-off time (tf) in Embodiment 1 of the present invention.

A semiconductor device according to Embodiment 1 has an IGBT with an LiPT (Low Injection Punch Through) structure as a semiconductor element. The semiconductor device according to this Embodiment 1 will next be described in accordance with the manufacturing steps based on FIGS. 1 to 16. FIG. 1 is a flow chart of the manufacturing method of the semiconductor device; FIGS. 2 to 8 are fragmentary cross-sectional views illustrating the manufacturing method of the semiconductor device; FIG. 9 is a graph showing displaced silicon atoms generated by the implantation of boron ions; FIG. 10 is a graph showing the relationship between the switch-off time (tf) and activation ratio of boron ions of the IGBT; FIG. 11 is a graph showing the relationship between the on-voltage (Vce) and switch-off time (Tf) of the IGBT; and FIGS. 12 to 16 are fragmentary cross-sectional views illustrating the manufacturing method of the semiconductor device.

Figure 2:
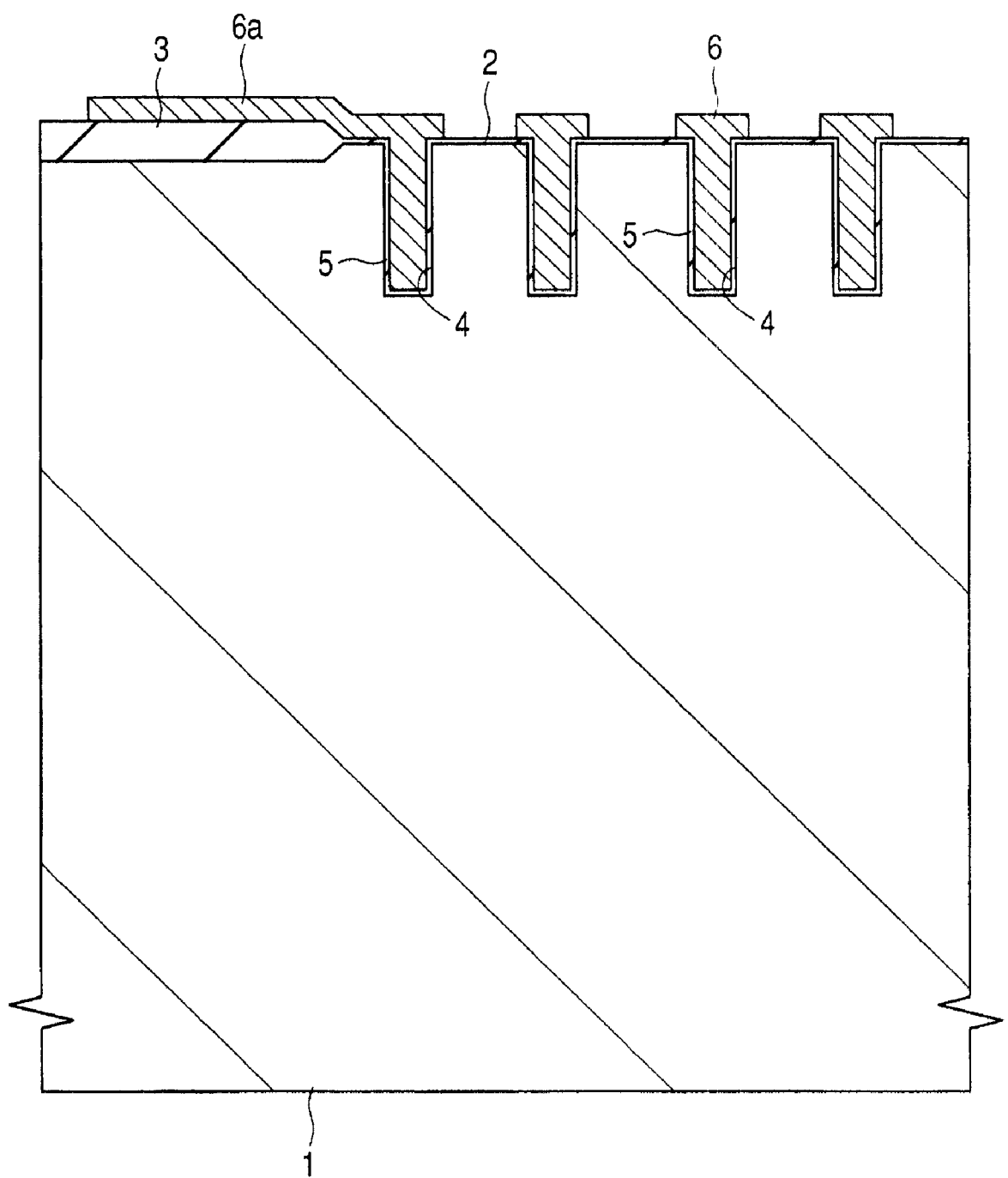
FIG. 2 is a fragmentary cross-sectional view illustrating the manufacturing method of the semiconductor device according to Embodiment 1 of the present invention.

As illustrated in FIG. 2, a semiconductor substrate 1 made of FZ single crystal silicon (Si) and lightly doped with n type impurities (for example, phosphorus (P)) is prepared (Step 101 of FIG. 1). The semiconductor substrate 1 at this stage is a semiconductor thin plate having a substantially disk-shaped plane, a so-called semiconductor wafer. It has a thickness of, for example, about 550 μm. A silicon oxide film 2 is formed over the surface (first surface) of the semiconductor substrate 1, for example, by thermal oxidation.

A silicon nitride film patterned by photolithography and etching is formed over the silicon oxide film 2, followed by heat treatment of the semiconductor substrate 1 to form a field insulating film 3 over the surface of the semiconductor substrate 1 without the silicon nitride film thereover. This field insulating film 3 is an element isolation region and a region partitioned by this region becomes an element formation region. The semiconductor substrate 1 is then washed with hydrofluoric acid and then hot phosphoric acid to remove therefrom the silicon nitride film.

With a photoresist film patterned by photolithography as a mask, the silicon oxide film 2 and semiconductor substrate 1 are etched successively to form a groove 4. The semiconductor substrate 1 is then heat treated to form a thermal oxide film 5 over the bottom and the side walls of the groove 4. This thermal oxide film 5 will be a gate insulating film of the IGBT.

A polycrystalline silicon film doped with an n type impurity (for example, phosphorus) is deposited over the semiconductor substrate 1 including the inside of the groove 4 to fill the groove 4 with the polycrystalline silicon film. With a photoresist film patterned by photolithography as a mask, the polycrystalline silicon film is etched. By leaving the polycrystalline silicon film in the groove 4, a gate electrode 6 of the IGBT is formed in the groove 4. At the same time, the polycrystalline silicon film is also left over a portion of the field insulating film 3 to form a polycrystalline silicon pattern 6a. The gate electrode 6 is electrically coupled to the polycrystalline silicon pattern 6a.

Figure 3:
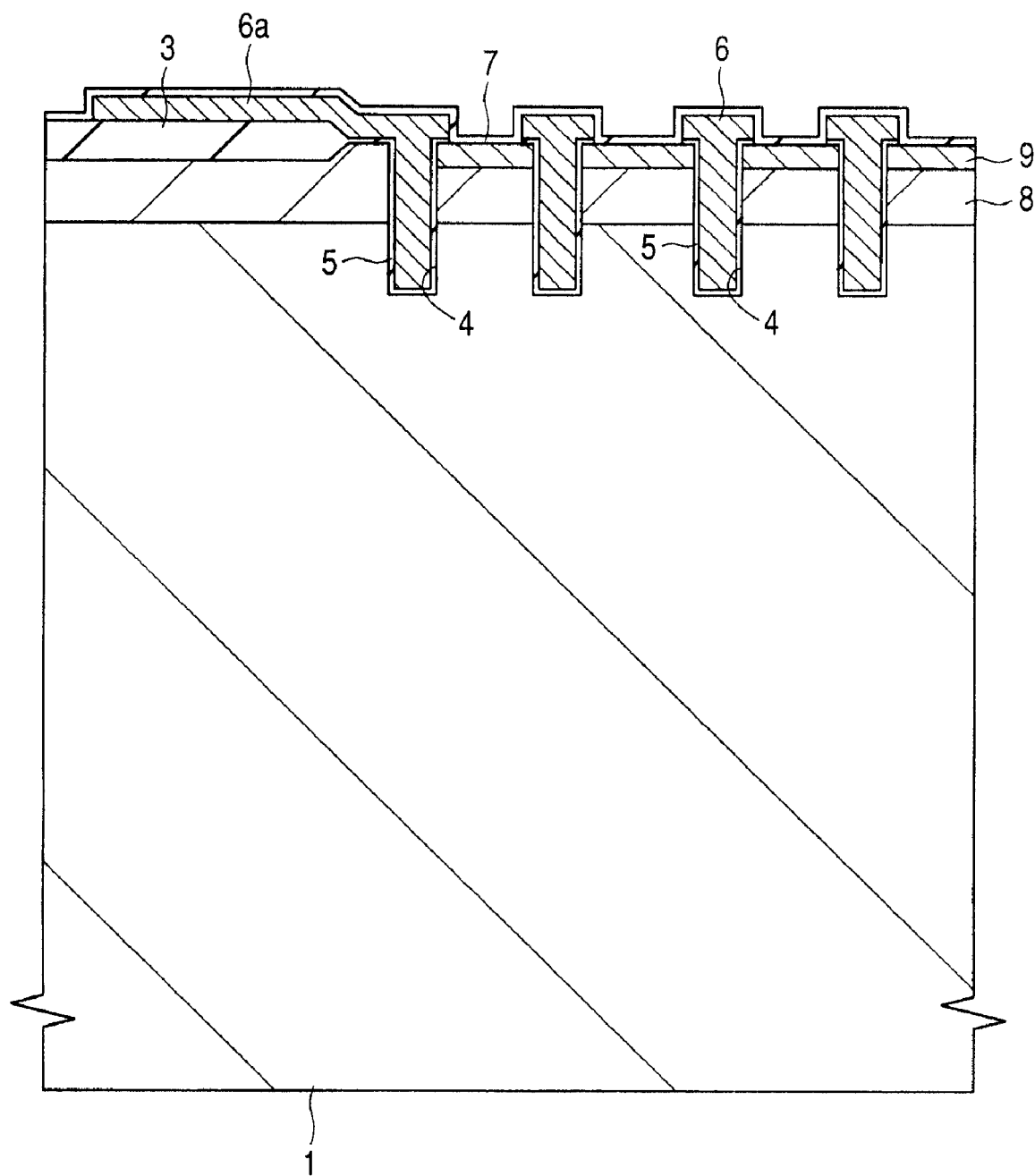
FIG. 3 is a fragmentary cross-sectional view of the semiconductor device during a manufacturing step following that of FIG. 2.

As illustrated in FIG. 3, after washing of the semiconductor substrate 1, an insulating film 7, for example, a silicon oxide film is deposited over the semiconductor substrate 1, for example, by CVD (chemical vapor deposition). With a photoresist film patterned by photolithography as a mask, p type impurity (for example, boron (B)) ions are then implanted into the semiconductor substrate 1. The semiconductor substrate 1 is then heat treated to activate and diffuse the impurity ions, whereby a p type semiconductor region 8 is formed. This p type semiconductor region 8 will be a channel region of the IGBT.

With a photoresist film patterned by photolithography as a mask, n type impurity (for example, arsenic (As)) ions are implanted into the semiconductor substrate 1. The semiconductor substrate 1 is then heat treated to activate and diffuse the impurity ions, whereby an $n^+$ type semiconductor region 9 is formed. This $n^+$ type semiconductor region 9 will be an emitter region of the IGBT. By the steps so far described, the channel region made of the p type semiconductor region 8 and the emitter region made of the $n^+$ type semiconductor region 9, of the constituents of the IGBT, are formed over the surface side of the semiconductor substrate 1.

Figure 4:
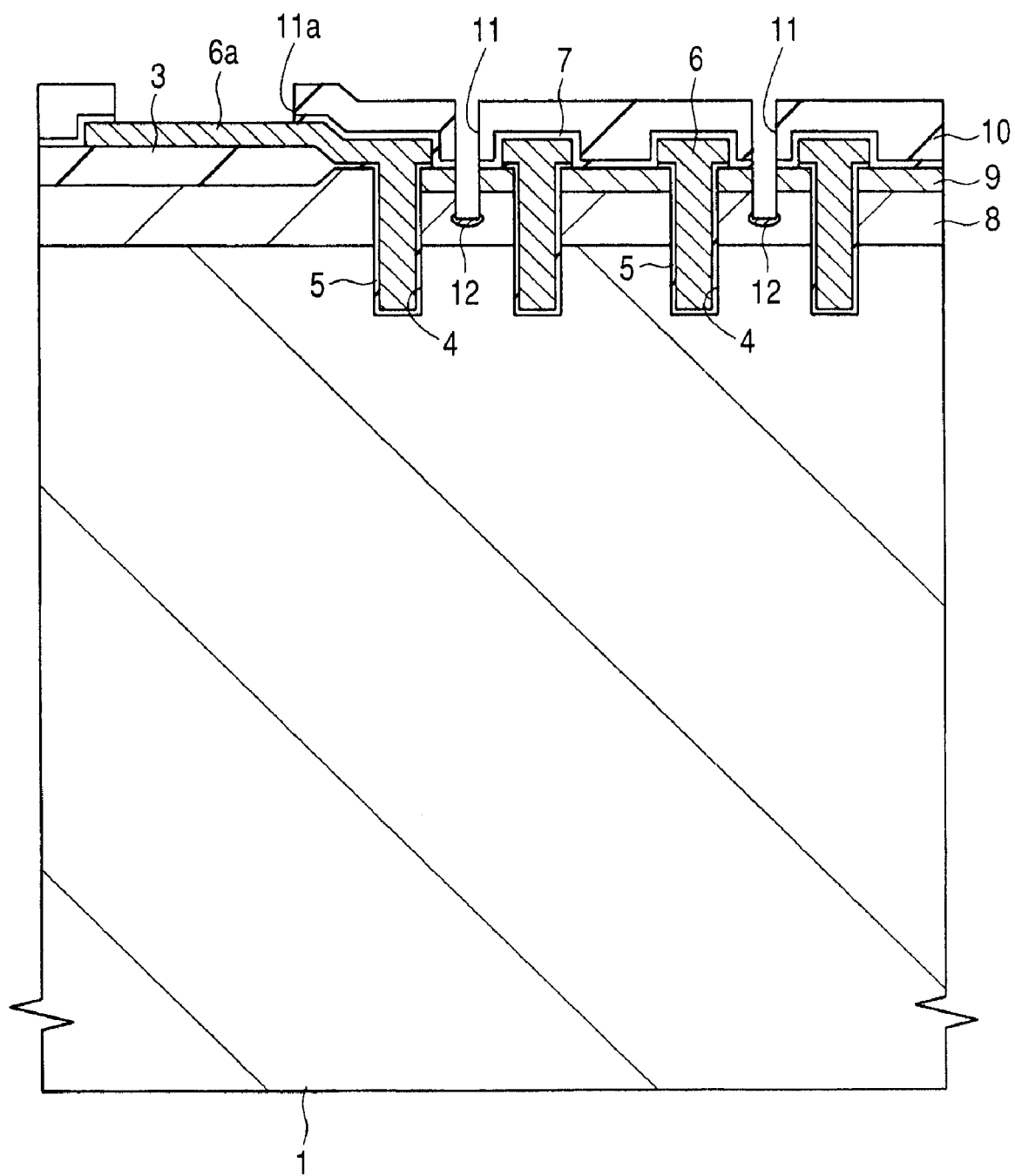
FIG. 4 is a fragmentary cross-sectional view of the semiconductor device during a manufacturing step following that of FIG. 3.

As illustrated in FIG. 4, after deposition of a PSG (Phospho Silicate Glass) film over the semiconductor substrate 1, an SOG (Spin On Glass) film is applied onto the PSG film, whereby an insulating film 10 made of the PSG film and SOG film is formed. With a photoresist film patterned by photolithography as a mask, the insulating film 10, insulating film 7 and semiconductor substrate 1 are etched successively to form a contact groove 11. The contact groove 11 is formed to penetrate through the n type semiconductor region 9, which will be an emitter region of the IGBT, between gate electrodes 6 adjacent to each other. At the same time, the insulating films 7 and 10 over the polycrystalline silicon pattern 6a are patterned to form a contact groove 11a reaching the polycrystalline silicon pattern 6a.

Next, a p type impurity (for example, boron difluoride ($BF_2$)) is introduced into the bottom of the contact groove 11, whereby a $p^+$ type semiconductor region 12 is formed so as to cover therewith the bottom of the contact groove 11. This $p^+$ type semiconductor region 12 is formed to provide an ohmic contact between the p type semiconductor region 8 and an interconnect which will be formed by a later step at the bottom of the contact groove 11.

Figure 5:
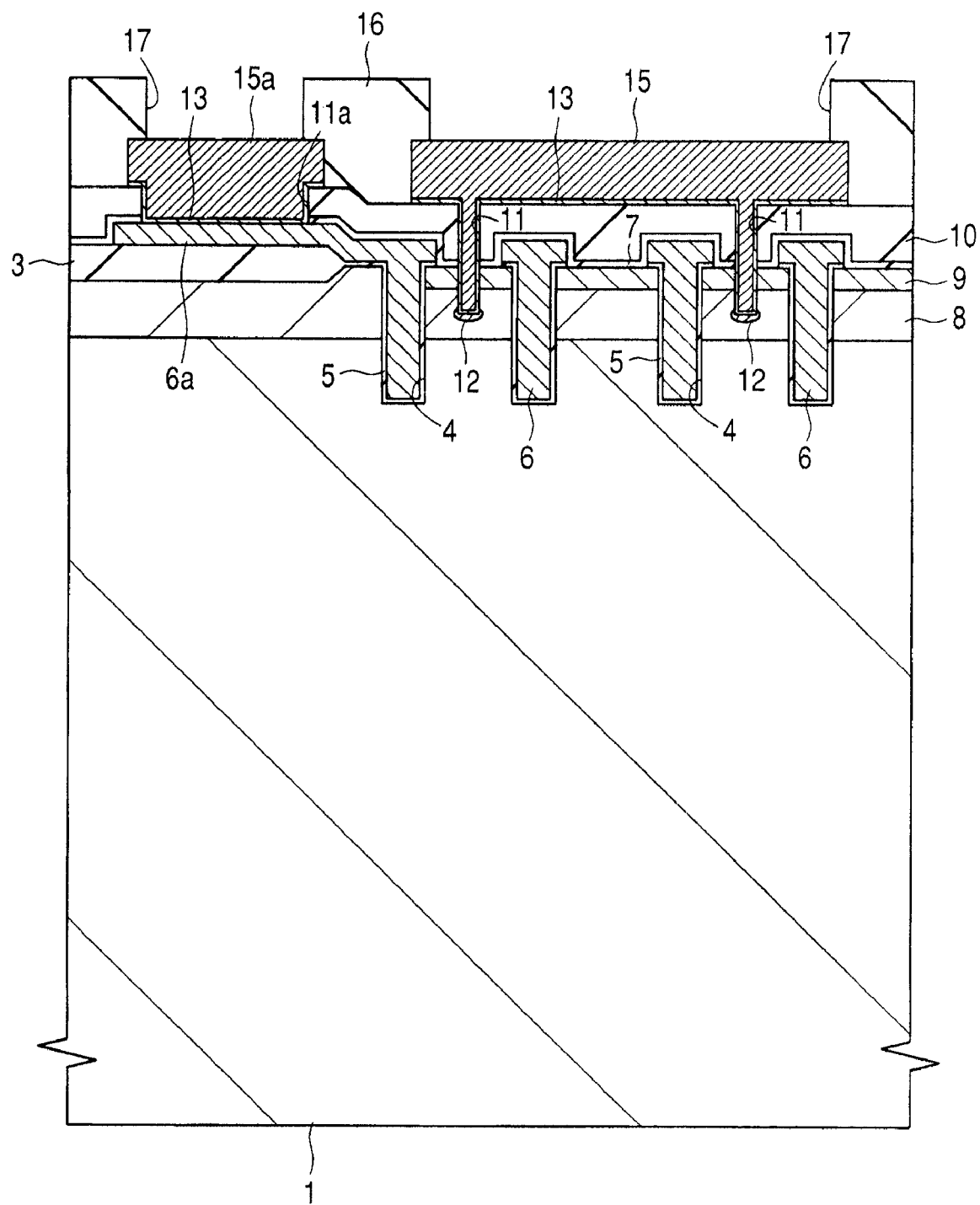
FIG. 5 is a fragmentary cross-sectional view of the semiconductor device during a manufacturing step following that of FIG. 4.

As illustrated in FIG. 5, a barrier conductor film 13 is formed over the semiconductor substrate 1 including the inside surfaces of the contact grooves 11 and 11a. This barrier conductor film 13 is formed, for example, by depositing a thin titanium tungsten (TiW) film by sputtering and then heat treating the semiconductor substrate 1. A conductive film is then formed over the barrier conductor film 13 while filling the contact grooves 11 and 11a with the conductive film. This conductive film is, for example, an aluminum alloy (AlSi) film formed by sputtering.

With a photoresist film patterned by photolithography as a mask, the conductive film and barrier conductor film 13 are etched successively, whereby interconnects 15 and 15a made of the conductive film are formed. The interconnect 15 will be an emitter electrode that is electrically coupled to the $n^+$ type semiconductor region 9. The interconnect 15a will be a gate interconnect that is electrically coupled to the gate electrode 6 via the polycrystalline silicon pattern 6a.

A polyimide resin film (protective film) 16 having a thickness of, for example, from about 2 to 10 μm is formed, for example, by the method of application. The polyimide resin film 16 may be either photosensitive or nonphotosensitive. This polyimide resin film 16 is a film of an uppermost layer among films deposited on the surface side of the semiconductor substrate 1 and serves to protect elements and interconnects. The polyimide resin film 16 is then patterned to form opening portions 17 on the interconnects 15 and 15a and leave the polyimide resin film 16 in regions other than the opening portions (Step 102 of FIG. 1).

Figure 6:
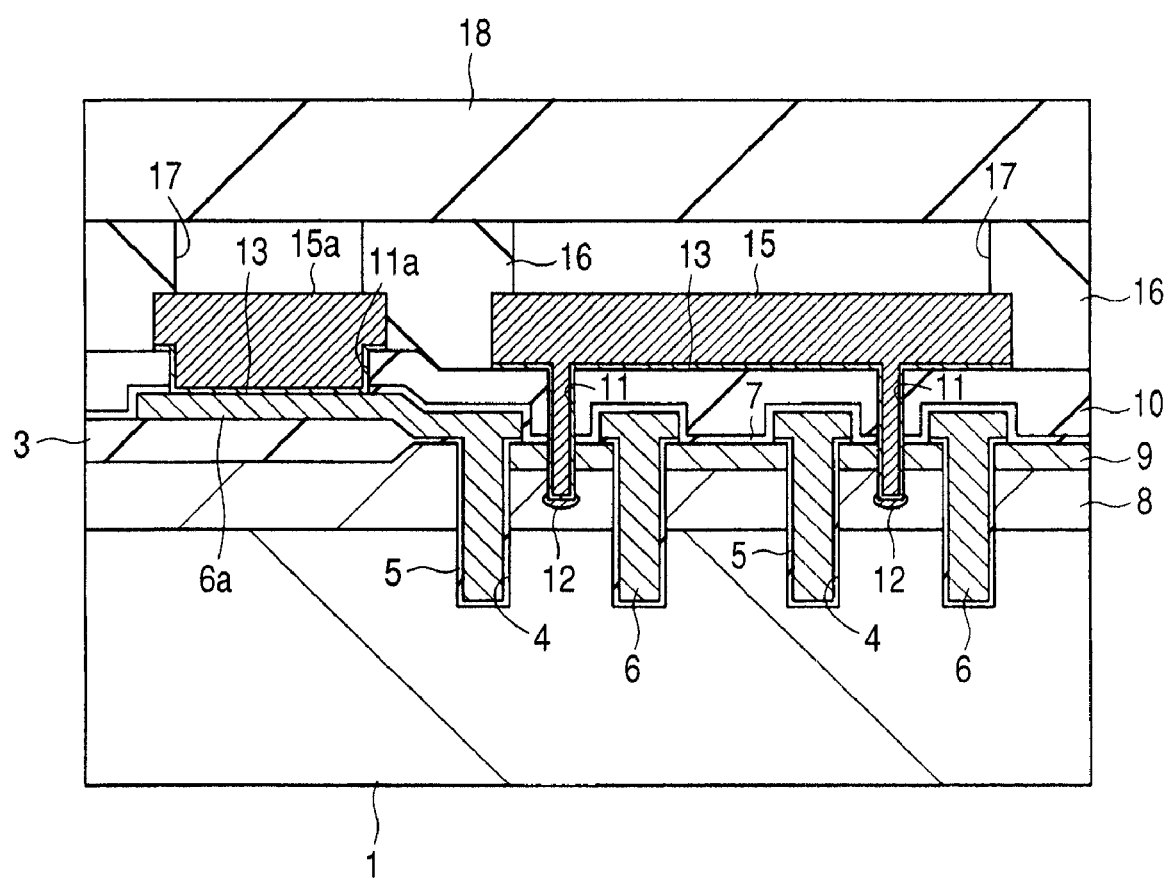
FIG. 6 is a fragmentary cross-sectional view of the semiconductor device during a manufacturing step following that of FIG. 5.

As illustrated in FIG. 6, a reinforcing plate 18 is attached with an adhesive onto the polyimide resin film 16 (Step 103 of FIG. 1). Quartz glass or ceramic, for example, may be used for the reinforcing plate 18. The thickness of quartz glass is, for example, about 700 μm and the quartz glass is advantageous because of a small content of impurities. The thickness of ceramic is, for example, about 650 μm and ceramic has good heat resistance up to about 400° C. A turning grinding material (for example, a grinding wheel) is then pressed against the back surface of the semiconductor substrate 1 for grinding, whereby the thickness of the semiconductor substrate 1 can be reduced to a predetermined thickness, for example, from about 70 to 120 μm (Step 104 of FIG. 1). Then, the back surface of the semiconductor substrate 1 is wet etched with hydrofluoric acid and ammonia to remove the distortion and foreign matters that have generated on the back surface of the semiconductor substrate 1 during grinding (Step 105 of FIG. 1).

Figure 7:
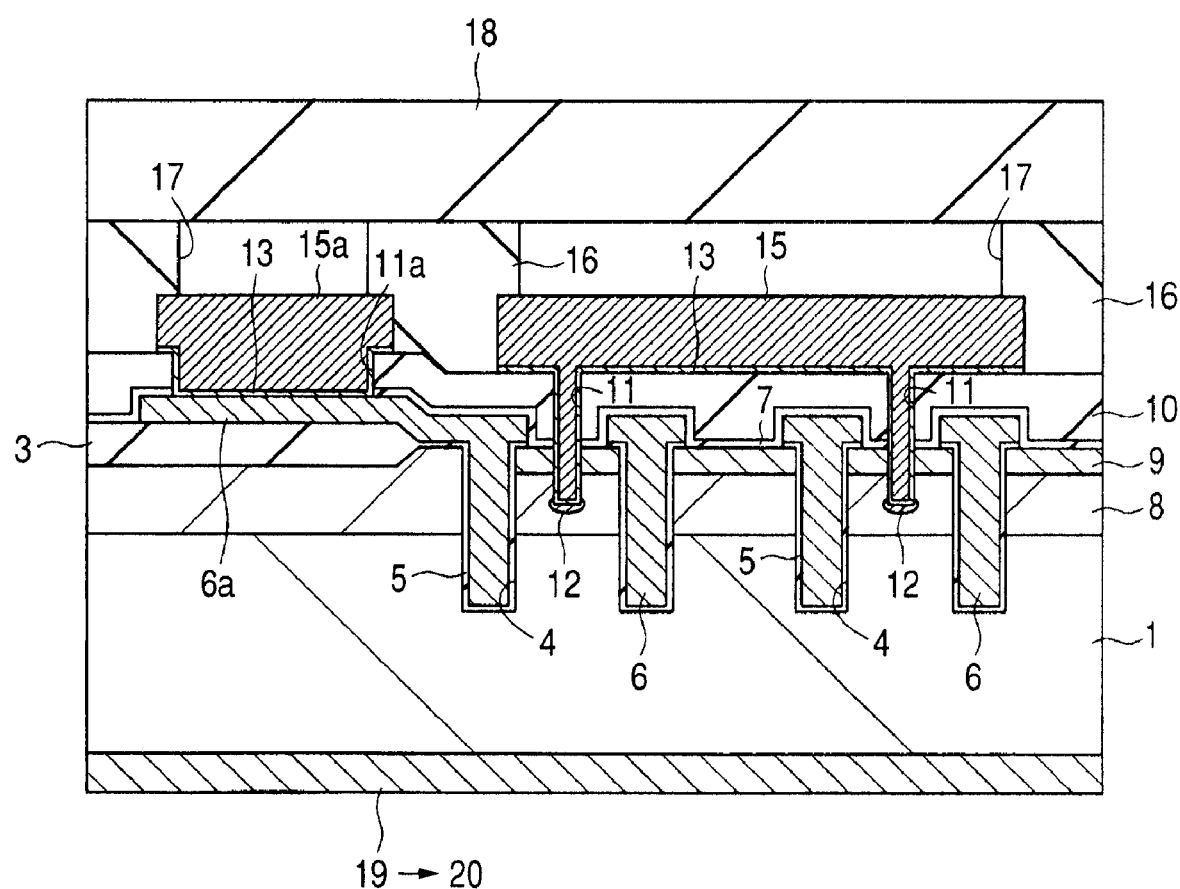
FIG. 7 is a fragmentary cross-sectional view of the semiconductor device during a manufacturing step following that of FIG. 6.

As illustrated in FIG. 7, n type impurity (first impurity, for example, phosphorus) ions are then implanted from the back surface (second surface) of the semiconductor substrate 1 to form an n type ion implantation region 19 on the back surface side of the semiconductor substrate 1 (Step 106 of FIG. 1). In the ion implantation, after an n type impurity (n type impurity ions) ionized by charging in an arc chamber is accelerated by an electric field, ion species and charged species are selected by a mass spectrometer. The n type impurity ions thus selected are accelerated further and implanted into the back surface of the semiconductor substrate 1. During ion implantation, the semiconductor substrate 1 is reinforced with the reinforcing plate 18 to prevent cracks. An implantation energy of phosphorus ions is, for example, from 300 to 600 keV; a dose is, for example, from $10^{12}$ to $10^{13}$ ions/cm$^2$; and a range is, for example, from 0.4 to 0.7 μm from the back surface of the semiconductor substrate 1.

Next, laser is irradiated from the back surface side of the semiconductor substrate 1 to activate the n type impurity ions implanted into the back surface of the semiconductor substrate 1, whereby a heavily-doped n$^+$ type semiconductor region (first semiconductor region) 20 having an ion activation ratio of 60% or greater is formed (Step 107 of FIG. 1). The n$^+$ type semiconductor region 20 functions as a field stop layer for suppressing the spreading of a depletion layer from the base region toward the collector region. Disposal of this field stop layer makes it possible to decrease the thickness of the lightly-doped base region (a portion of the semiconductor substrate 1 between the channel region and the field stop layer) and thereby decrease the on-voltage (Vce) of the IGBT. The term "on-voltage" means a voltage between the emitter region and collector region when a predetermined current, for example, 200A flows between the emitter region and collector region.

An avalanche voltage of an IGBT which had an NPT (None Punch Through) structure not equipped with a field stop layer; had a resistance of 65 Ocm and a thickness of 123 μm in a lightly-doped n type base region; and had a thickness of 0.4 μm in a highly-doped p type collector region was calculated by simulation, resulting in about 780V. An avalanche voltage of an IGBT which had an LiPT structure equipped with a field stop layer; had a resistance of 65 Ocm and a thickness of 123 μm in a lightly-doped n type base region; and had a thickness of 0.4 μm in a highly-doped p type collector region was calculated by simulation, resulting in about 1345V. The results suggest that the field stop layer of the IBGT having an LiPT structure shares a breakdown voltage of about 575V (=1345−780). It is presumed that addition of a voltage exceeding this to the field stop layer may terminate the extension of a depletion layer, the breakdown voltage which the field stop layer shares becomes about 2.5V, and after that, only the breakdown voltage which the base region must share will increase and cause avalanche. Accordingly, it is possible to decrease the thickness of the base region to about 120 μm in the IGBT having an LiPT structure, though about 200 μm is necessary in the IGBT having an NPT structure.

In order to cause the field stop layer to function as a layer sharing a withstand voltage, it is necessary to adjust the activation ratio of n type impurity ions of the field stop layer to 60% or greater, fully repair crystal defects generated by the ion implantation and prevent a depletion layer, which has extended from the base region, from reaching the collector region. For this purpose, laser irradiation conditions for activating n type impurity ions, as well as implantation conditions of them, become important. As a result of investigation by the present inventors, an activation ratio of n type impurity ions as high as from 60 to 65% was accomplished when laser irradiation was performed, for example, using a 2-pulse mode at a wavelength of 527 nm, pulse width of 100 ns, and energy density of 1.8 J/cm$^2$ while setting a delay time between these pulses, for example, at 500 ns and a pulse overlap, for example, at 66%.

The ion activation ratio is defined by the below-described equation (1). In SRP (Spreading Resistance Profiling) method, resistance between two probes is measured along a ground bevel surface and based on the resistance, resistivity and carrier concentration in the depth direction are determined. Only the concentration distribution of activated ions can be found.

Equation (1): Activation ratio=(sheet carrier concentration determined by SRP/dose of impurity ions)×100 (%). The reinforcing plate 18 is attached to the surface side of the semiconductor substrate 1 with an adhesive. The heat resistance of this adhesive is usually 140° C. or less and is low so that heat treatment at about 800 to 900° C., for example, by furnace annealing or lamp annealing deteriorates the adhesive, leading to peeling of the reinforcing plate 18. In laser annealing by heating through laser irradiation, on the other hand, a temperature rise occurs at the depth of the semiconductor substrate 1 not greater than 10 μm. Even by irradiation of laser to the back surface side of the semiconductor substrate 1, the temperature on the surface side of the semiconductor substrate 1 remains at 80 to 100° C. This method can therefore prevent deterioration of the adhesive and prevent peeling of the reinforcing plate 18.

Figure 8:
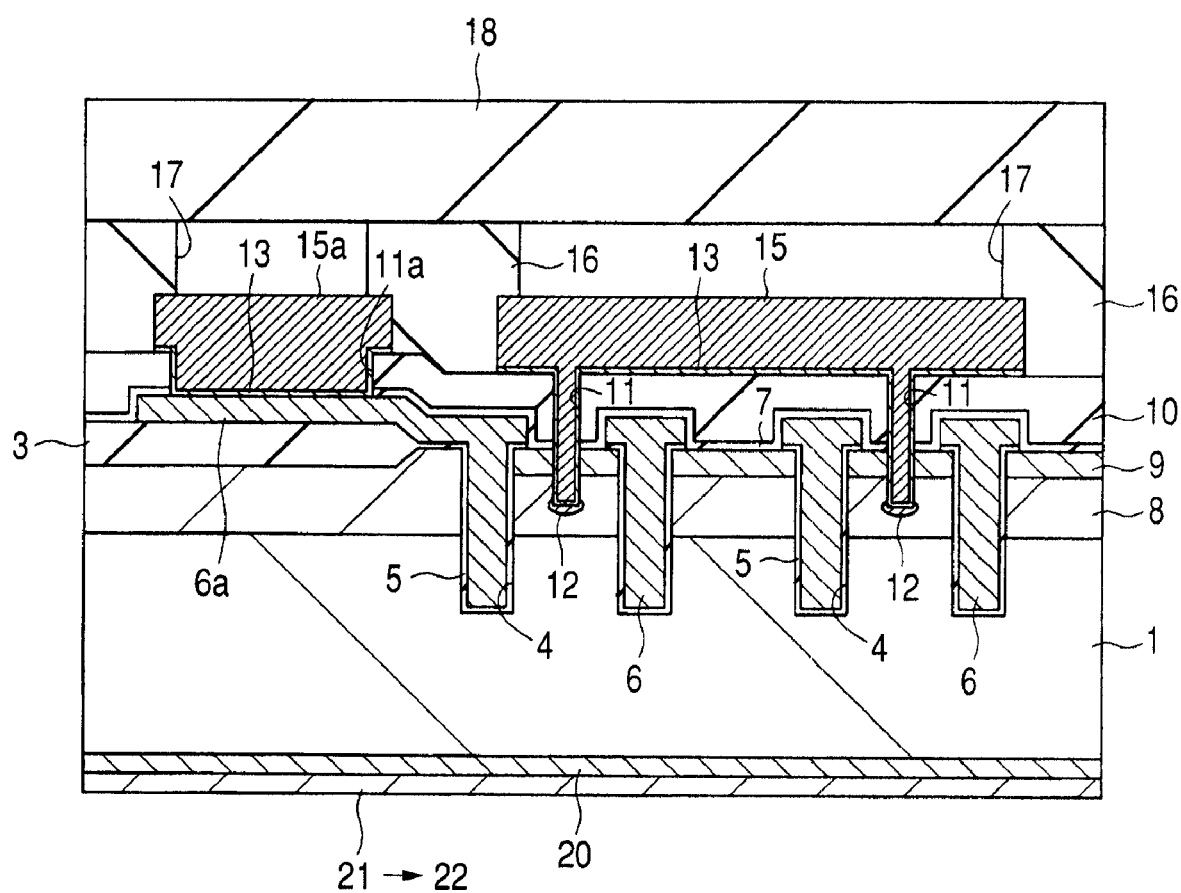
FIG. 8 is a fragmentary cross-sectional view of the semiconductor device during a manufacturing step following that of FIG. 7.

As illustrated in FIG. 8, p type impurity (second impurity, for example, boron) ions are implanted into a region shallower than the n$^+$ type semiconductor region 20 on the back surface of the substrate 1 to form a p type ion implantation region 21 (Step 108 of FIG. 1). In ion implantation, p type impurity (p type impurity ions) ionized by charging in an arc chamber is accelerated by an electric field, ion species are separated from charged species. The p type impurity ions thus selected are accelerated further and implanted into the back surface of the semiconductor substrate 1. During ion implantation, the semiconductor substrate 1 is reinforced with the reinforcing plate 18 to prevent cracks of the semiconductor substrate 1. An implantation energy of boron ions is, for example, from 30 to 60 keV; a dose is, for example, from $10^{14}$ to $10^{16}$ ions/cm² and a range is, for example, from 0.1 to 0.3 μm from the back surface of the semiconductor substrate 1.

Then, a p⁺ semiconductor region (second semiconductor region) 22 is formed by exposing the back surface of the semiconductor substrate 1 to laser to activate the above-described p type impurity ions implanted into the back surface of the semiconductor substrate 1 (Step 109 of FIG. 1). The p⁺ type semiconductor region 22 is a collector region and is formed as the outermost layer on the back surface of the semiconductor substrate 1. In the p⁺ type semiconductor region 22, different from the n⁺ type semiconductor region 20, it is desired to leave defects generated by the ion implantation (refer to FIG. 9 which will be described later) and control the activation ratio of the p type impurity ions to from 1 to 15% (refer to FIG. 10 which will be described later). Defects generated by the ion implantation are left in the p⁺ type semiconductor region 22 and utilized as a lifetime killer in order to accomplish high-speed switching characteristics of the IGBT. Laser irradiation conditions for activating p type impurity ions, as well as the implantation conditions of p type impurity ions, therefore become important. As a result of investigation by the present inventors, an activation ratio of p type impurity ions of about 11% was accomplished when laser irradiation was performed, for example, using a 2-pulse mode at a wavelength of 527 nm, pulse width of 100 ns, and energy density of 0.71 J/cm² while setting a delay time between these pulses, for example, at 300 ns and a pulse overlap, for example, at 66%.

As in the formation of the n⁺ type semiconductor region 20, use of laser annealing for activating p type impurity ions which have been implanted makes it possible to prevent deterioration of an adhesive, thereby preventing peeling of the reinforcing plate 18.

FIG. 9 is a graph illustrating displaced Si atoms (Displaced Si) generated by the implantation of boron ions. RBS (Rutherford Backscattering Spectrometry) is employed for the measurement. Boron ions are implanted at an implantation energy of 40 keV and dose of $10^{15}$ ions/cm² and laser is irradiated at a wavelength of 527 nm, pulse width of 100 ns and energy density of 0.7 J/cm². As is apparent from FIG. 9, a range of boron ions is about 0.2 μm and damages (defects) functioning as a lifetime killer are present in the vicinity of it.

FIG. 10 is a graph showing one example of the relationship between the switch-off time (tf) and activation ratio of boron ions of the IGBT obtained by the present inventors. The term "switching time" as used herein means a difference (t(10%)–t(90%)) between time (t(90%)) required for current to decrease to 90% and time (t(10%)) required for current to decrease to 10%, each just after the voltage between emitter region and collector region is turned off. As the switching time becomes shorter, higher-speed switching characteristics can be accomplished. Boron ions are implanted at an implantation energy of 40 keV and dose of from $10^{14}$ to $10^{15}$ ions/cm², and they are exposed to laser at a wavelength of 527 nm, pulse width of 100 ns, energy density of from 0.7 to 1.8 J/cm² and pulse overlap of 66%. As illustrated in FIG. 10, the smaller the activation ratio of boron ions, the shorter the switch-off time. For example, when the activation ratio of boron ions is 15% or less, the switch-off time not greater than 220 ns can be accomplished.

By the steps so far described, formed are the base region (semiconductor substrate 1) having a thickness of from about 70 to 120 μm, the field stop layer (n⁺ type semiconductor region 20) having a thickness of from about 1 to 1.5 μm and having an activation ratio of n type impurity ions of 60% or greater, and the collector region (p⁺ type semiconductor region 22) having a thickness of from about 0.1 to 0.5 μm and an activation ratio of p type impurity ions of from 1 to 15%.

In the IGBT according to Embodiment 1, activation annealing of n type impurity ions implanted for the formation of a field stop layer and activation annealing of p type impurity ions implanted for the formation of a collector region are performed in separate steps, whereby activation ratios thus obtained are suited for the field stop layer and collector region, respectively. Described specifically, by adjusting the activation ratio of n type impurity ions of the field stop layer to 60% or greater to raise the breakdown voltage of the field stop layer, it is possible to narrow the width of the base region, thereby reducing the on-voltage. By adjusting the activation ratio of p type impurity ions of the collector region to from 1 to 15% to effectively utilize defects as a lifetime killer, it is possible to shorten the switch-off time.

The loss of IGBT is usually expressed by the sum of a conduction loss and switching loss. A high-performance IGBT can be realized by reducing both losses. Described specifically, in a power device (for example, an HEV (Hybrid Electric Vehicle) inverter) required to have an operating frequency of from 10 to 30 kHz and output capacitance of from 20 to 300VA, when an IGBT is required to have an output current of 200 A and breakdown voltage of 1200V, the IGBT is required to satisfy the on-voltage of 2.5V or less (an adequate range of the on-voltage may be 2.5V is less, but is not limited to this range, depending on the conditions; and a range of the on-voltage suited for mass production may be 2.2V or less, with a range of 2.0V or less being most suited); and the IGBT is required to satisfy the switching time of 300 ns or less (an adequate range of the switching time may be 300 ns or less, but is not limited to this range, depending on the conditions; and a range of the switching time suited for mass production may be 220 ns or less, with a range of 200 ns or less being most suited).

FIG. 11 is a graph showing the relationship between the on-voltage (Vce) and switch-off time (tf) of the IGBT obtained by the present inventors. In FIG. 11, the performance which the IGBT is required to have falls within a hatched area. FIG. 11 shows the characteristics of an IGBT subjected to laser irradiation twice according to Embodiment 1; characteristics of an IGBT (which will next be referred to as "R1-IGBT") using a double epitaxial wafer; and characteristics of an IGBT (which will next be referred to as "R2-IGBT") subjected to laser irradiation once. The IGBT according to Embodiment 1 is obtained by implanting (at an implantation energy of 350 keV and a dose of $10^{13}$ ions/cm²) phosphorus ions for the formation of a field stop layer, activating the phosphorus ions by laser irradiation (at a wavelength of 527 nm, pulse width of 500 ns, energy density of 1.8 J/cm² and pulse overlap of 66%), implanting (at an implantation energy of 40 keV and a dose of $10^{15}$ ions/cm²) boron ions for the formation of a collector region, and activating the boron ions by laser irradiation (at a wavelength of 527 nm, pulse width of 300 ns, energy density of 0.7 J/cm² and pulse overlap of 66%). The R2-IGBT is obtained by implanting (at an implantation energy of 350 keV and a dose of $10^{13}$ ions/cm²) phosphorus ions for the formation of a field stop layer, implanting (at an implantation energy of 40 keV and a dose of $5\times10^{13}$ ions/cm²) boron ions for the formation of a collector region, and then activating these ions by laser irradiation (at a wavelength of 527 nm, pulse width of 500 ns, energy density of 1.8 J/cm² and pulse overlap of 66%).

As illustrated in FIG. 11, the characteristics of the R1-IGBT and R2-IGBT are outside the performance area (area defined by the on-voltage not greater than 2.5V and switching time not greater than 300 ns), showing that the neither R1-IGBT nor R2-IBTB can satisfy the characteristics required for IGBT. The IGBT according to Embodiment 1, on the other hand, has performance superior to that of each of R1-IGBT and R2-IGBT and has on-voltage of about 2.0V and switching time of about 200 ns. This suggests that the IGBT according to Embodiment 1 can satisfy the characteristics required for it.

Figure 12:
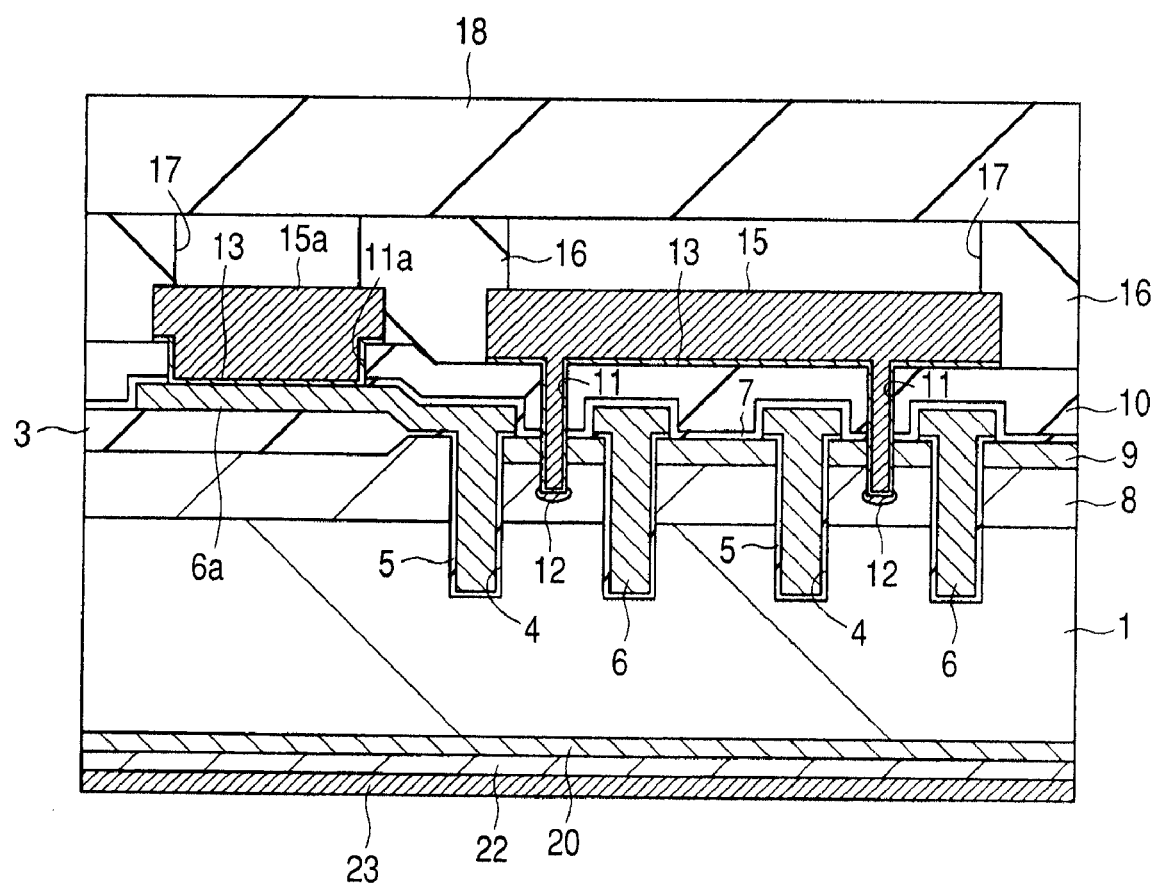
FIG. 12 is a fragmentary cross-sectional view of the semiconductor device during a manufacturing step following that of FIG. 8.

After washing the back surface of the semiconductor substrate 1 with hydrofluoric acid, a conductive film, for example, a nickel (Ni) film is formed by sputtering over the back surface of the semiconductor substrate 1 (Step 110 of FIG. 1). The resulting nickel film has a thickness of, for example, about 0.05 μm. As illustrated in FIG. 12, the nickel film is then reacted with the semiconductor substrate 1 by laser annealing to form a compound (nickel silicide (NiSi) film 23) to provide an ohmic contact (Step 111 of FIG. 1). Laser irradiation is performed, for example, by 2-pulse mode at a wavelength of 527 nm and energy density of 1.0 J/cm$^2$ while setting a delay time between two pulses to 0 ns and a pulse overlap of 50%. Use of laser annealing enables to suppress a temperature rise on the surface side of the semiconductor substrate 1.

Figure 13:
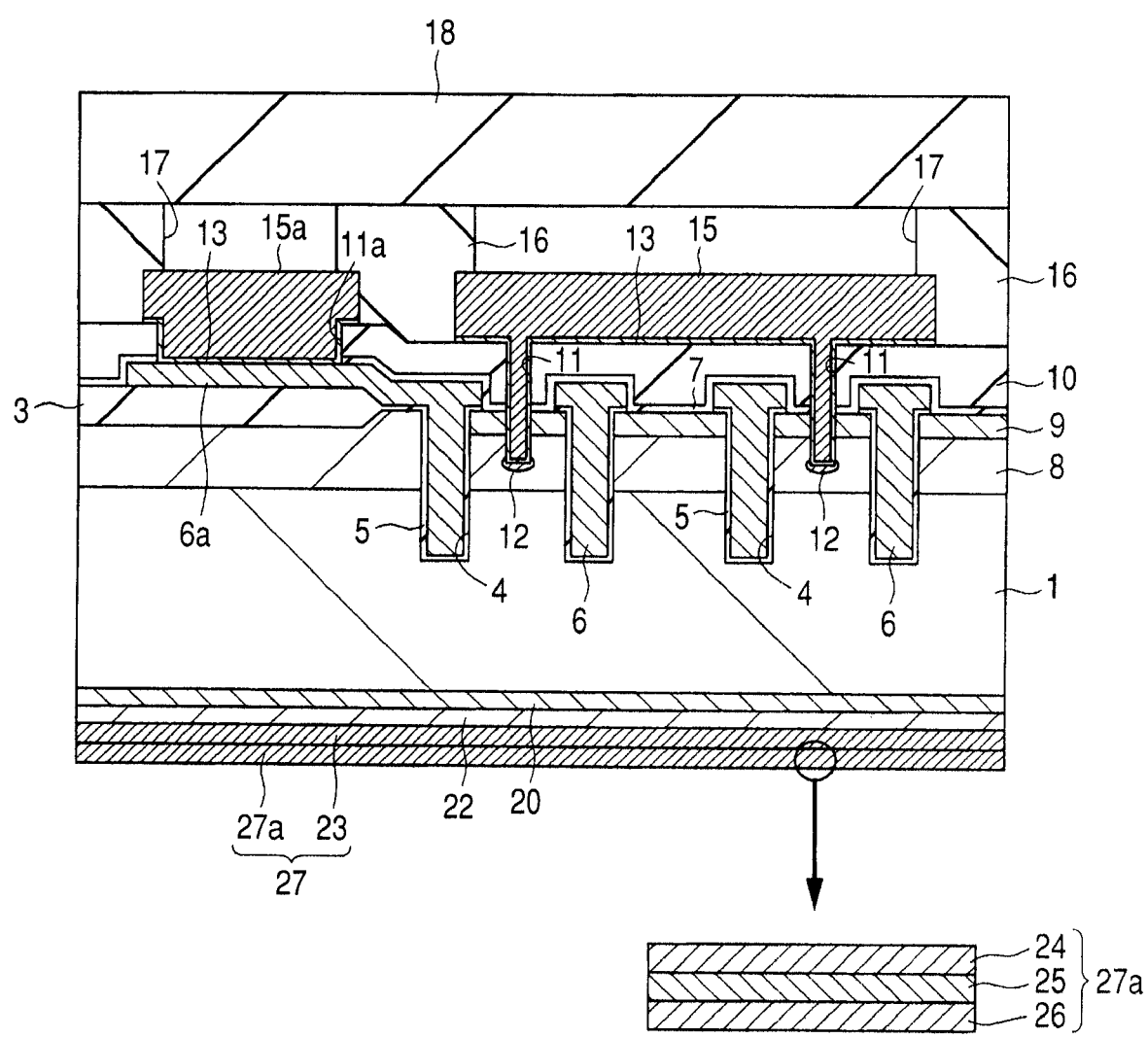
FIG. 13 is a fragmentary cross-sectional view of the semiconductor device during a manufacturing step following that of FIG. 12.

As illustrated in FIG. 13, a titanium (Ti) film 24, a nickel film 25, and a gold (Au) film 26, for example, are then formed successively over the nickel silicide film 23 on the back surface side of the semiconductor substrate 1 by sputtering or vacuum deposition, whereby a film stack 27a of these films is formed (Step 112 of FIG. 1). The titanium film 24, the nickel film 25 and the gold film 26 have a thickness of, for example, about 0.1 μm, about 0.6 μm and about 0.1 μm, respectively. The nickel silicide film 23 and the film stack 27a will be a collector electrode 27 serving as an extraction electrode of the collector region.

Figure 14:
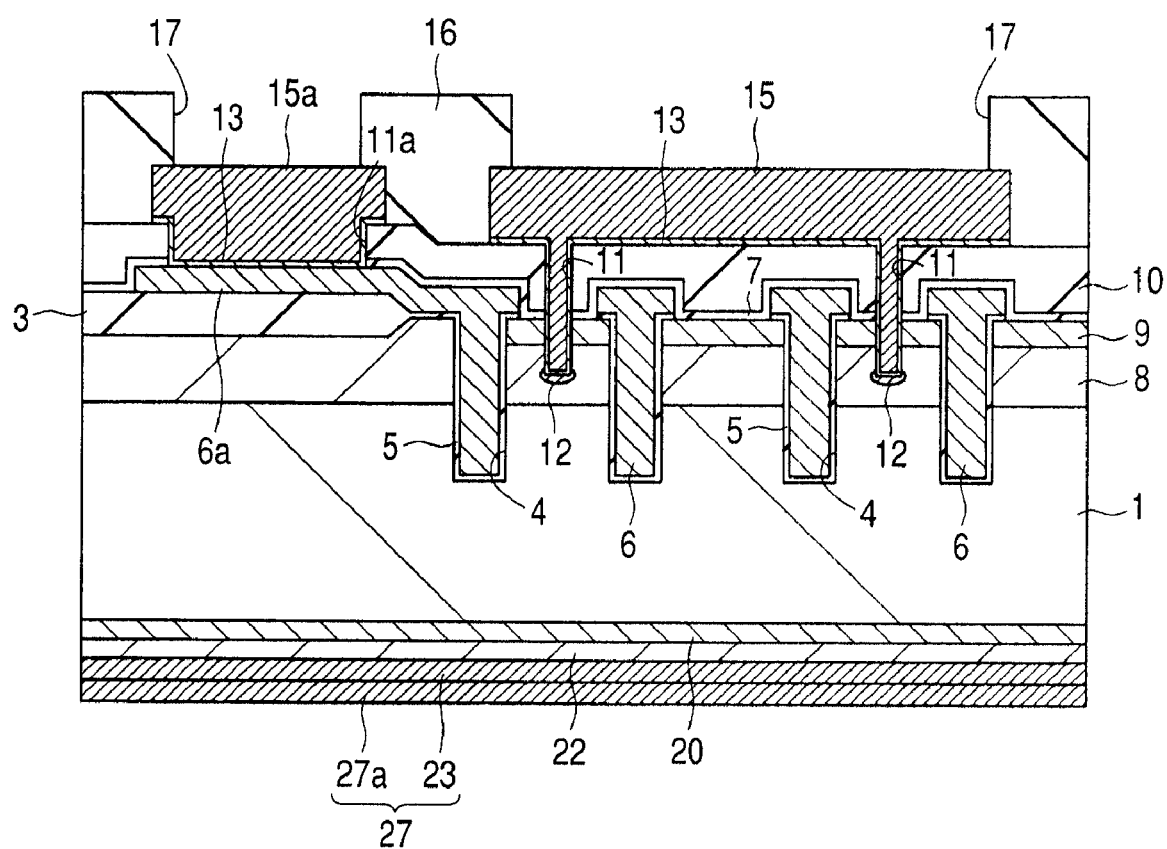
FIG. 14 is a fragmentary cross-sectional view of the semiconductor device during a manufacturing step following that of FIG. 13.
Figure 15:
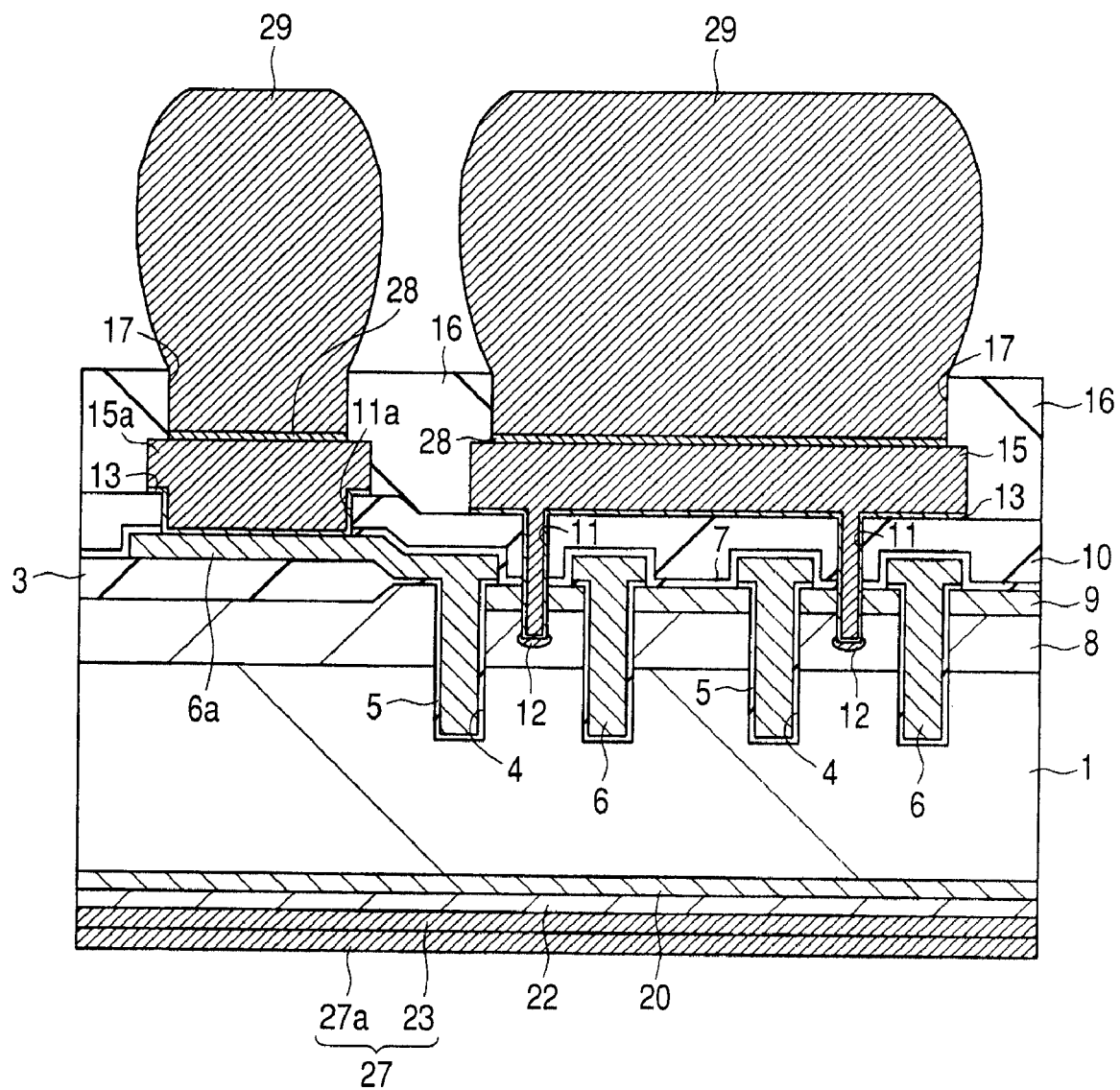
FIG. 15 is a fragmentary cross-sectional view of the semiconductor device during a manufacturing step following that of FIG. 14.

As illustrated in FIG. 14, the reinforcing plate 18 is then peeled off from the surface side of the semiconductor substrate 1 (Step 113 of FIG. 1). As illustrated in FIG. 15, thin conductive films 28 are formed, by electroplating, over the surfaces of the interconnects 15 and 15a which have appeared from the bottom of the opening portions 17. The conductive films 28 are each, for example, a film stack obtained by depositing a nickel film and a gold film one after another. The nickel film has a thickness of, for example, from about 1 to 5 μm, while the gold film has a thickness of, for example, about 80 nm. The conductive film 28 will be an underlying film of a bump electrode which will be formed in the later step.

With a metal mask patterned according to a planar pattern of the opening portions 17, a solder paste made of, for example, silver (Ag), tin (Sn) and copper (Cu) is printed to fill the opening portions 17 therewith. Then, reflow treatment is performed to form bump electrodes 29 of about 150 μm thick which are electrically coupled to the interconnects 15 and 15a. The resulting bump electrode 29 and interconnect 15 will be an emitter electrode to be electrically coupled to the n$^+$ type semiconductor region 9 which will be an emitter region of the IGBT. The semiconductor substrate 1 in the wafer form is then diced into individual semiconductor chips for example by dicing along regions to be divided.

Figure 16:
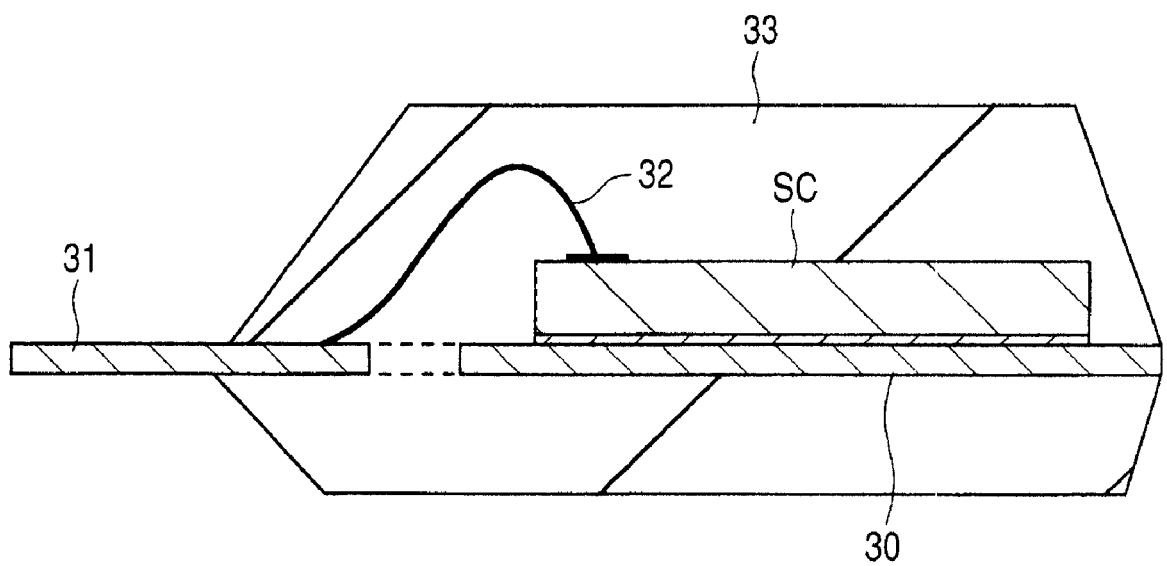
FIG. 16 is a fragmentary cross-sectional view of the semiconductor device during a manufacturing step following that of FIG. 15.

As illustrated in FIG. 16, the semiconductor chip SC thus obtained is then firmly fixed over, for example, a lead frame 30. A pad portion on the surface of the semiconductor chip SC and a lead 31 are coupled to each other with a gold wire 32 or the like. A molten resin is then poured into a mold by which the lead frame 30 is sandwiched, and hardened to seal the periphery of the semiconductor chip SC and gold wire 32 with a resin 33. A lead 31 protruded from the resin 33 is then formed into a desired shape, whereby fabrication of a semiconductor device is completed.

In Embodiment 1, activation annealing of n type impurity ions implanted for the formation of the field stop layer (n$^+$ type semiconductor region 20) and activation annealing of p type impurity ions implanted for the formation of the collector region (p$^+$ type semiconductor region 22) are performed in separate steps to adjust the activation ratio of the n type impurity ions to 60% or greater and the activation ratio of the p type impurity ions to from 1 to 15%. This makes it possible to form an IGBT having a high breakdown voltage and high-speed switching characteristics. Described specifically, it is possible to obtain a field stop layer having a high breakdown voltage by adjusting the activation ratio of n type impurity ions in the field stop layer (n$^+$ type semiconductor region 20) to 60% or greater. This makes it possible to thin the base region (semiconductor substrate 1), leading to a reduction in the on-voltage. In addition, it is possible to increase the switching operation speed of the IGBT by adjusting the activation ratio of p type impurity ions in the collector region (p$^+$ type semiconductor region 22) to from 1 to 15% to leave defects, which have been generated by the ion implantation, as a lifetime killer.

Moreover, use of a film stack made of films of nickel silicide 23, titanium 24, nickel 25 and gold 26 makes it possible to provide an ohmic contact with the collector region (p$^+$ type semiconductor region 22) and in addition, to form a collector electrode that can prevent corrosion which will otherwise occur by the moisture or the like.

Moreover, by using laser annealing for activation annealing of impurity ions and formation of the nickel silicide film 23, a temperature rise on the surface side of the semiconductor substrate 1 can be suppressed. This makes it possible to prevent peeling of the reinforcing plate 18 which will otherwise occur owing to the deterioration of an adhesive for attaching the reinforcing plate 18.

Embodiment 2

Figure 17:
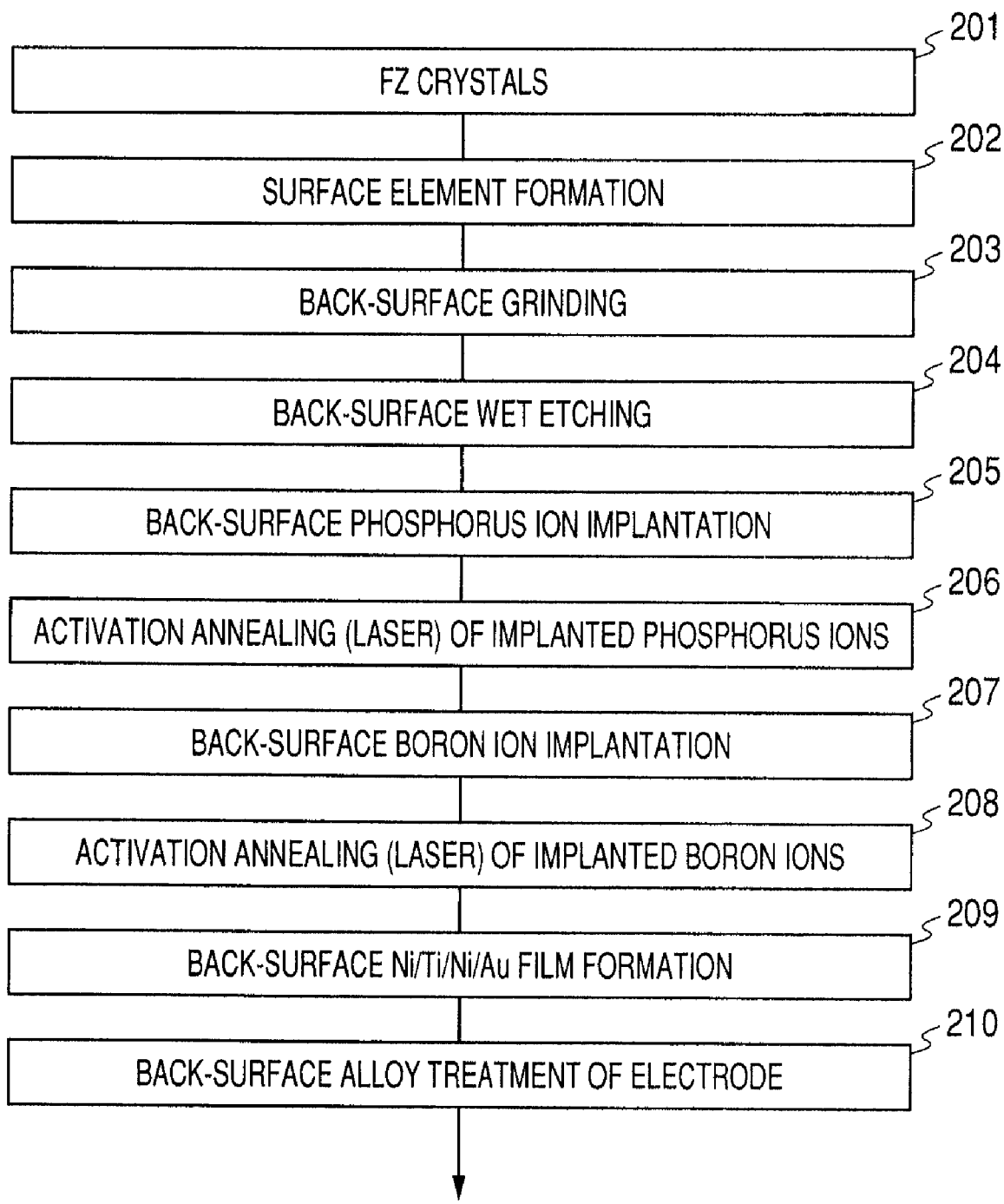
FIG. 17 is a flow chart explaining the manufacturing method of a semiconductor device according to Embodiment 2 of the present invention.

A semiconductor device according to Embodiment 2 has, similar to the above-described one according to Embodiment 1, an IBGT having an LiPT structure as a semiconductor element, but is different from it in the thickness of the semiconductor substrate. In Embodiment 1, described was an IGBT using a semiconductor substrate having a thickness not greater than 120 μm (for example, from 70 to 120 μm). In Embodiment 2, on the other hand, an IGBT uses a semiconductor substrate having a thickness exceeding 120 μm and the reinforcing plate used in Embodiment 1 is not used during the fabrication of the IGBT. Such a semiconductor device of Embodiment 2 will be described based on FIGS. 17 to 21. FIG. 17 is a flow chart of the manufacturing method of the semiconductor device; and FIGS. 18 to 21 are fragmentary cross-sectional views illustrating the manufacturing method of the semiconductor device. Manufacturing steps until the formation of an emitter electrode (interconnect 15) of the IGBT on the surface side of the semiconductor substrate and patterning of a polyimide resin film 16 which has been applied thereto (Steps 201 and 202 of FIG. 17) are similar to those of Embodiment 1 so that the description on them is omitted.

Similar to Embodiment 1 (Step 201 of FIG. 17), a gate electrode 6, channel region (p type semiconductor region 8), emitter region (n$^+$ type semiconductor region 9), emitter electrode (interconnect 15) and the like are formed on the surface side of the semiconductor substrate 1 and then, a polyimide film is laid over the emitter electrode and the like to protect them (Step 202 of FIG. 17).

Figure 18:
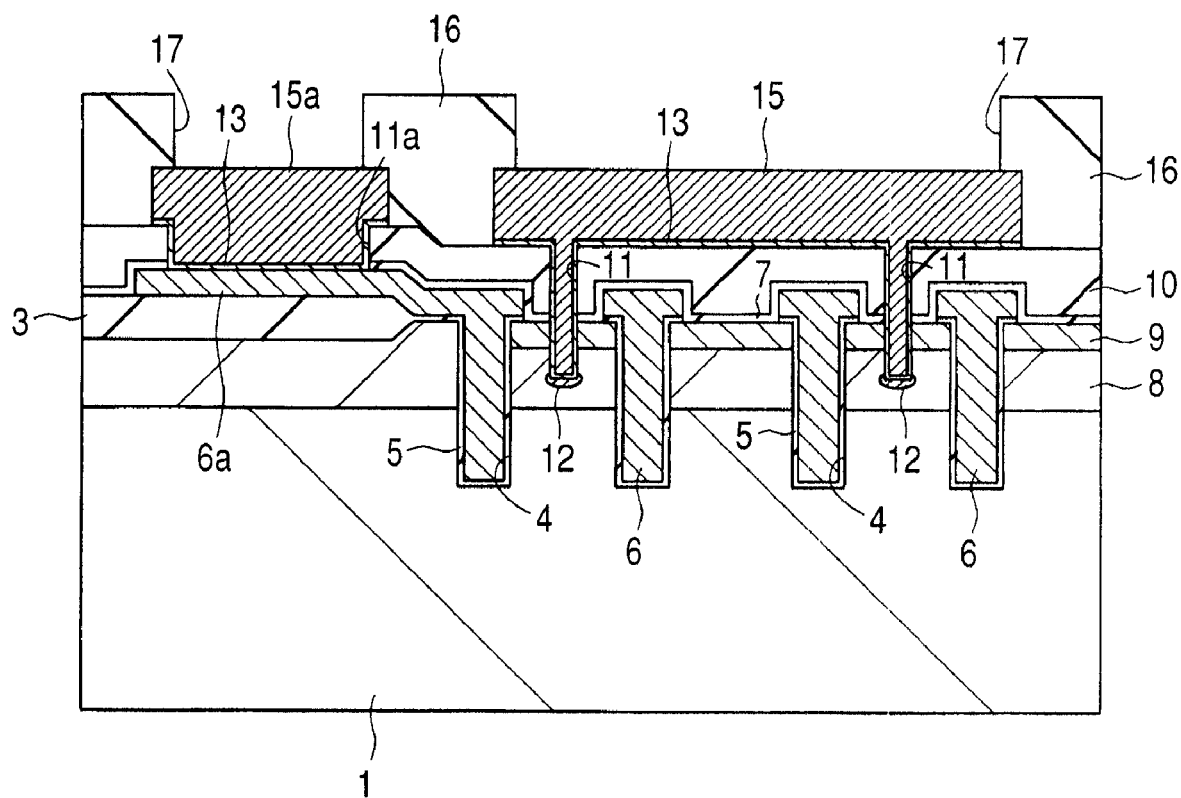
FIG. 18 is a fragmentary cross-sectional view illustrating the manufacturing method of the semiconductor device according to Embodiment 2 of the present invention.

As illustrated in FIG. 18, a turning grinding material (for example, grinding wheel) is then pressed against the back surface of the semiconductor substrate 1 to thin the semiconductor substrate 1 to a predetermined thickness, for example, 120 to 200 μm (Step 203 of FIG. 17). The back surface of the semiconductor substrate 1 is then washed with hydrofluoric acid and ammonia to remove the distortion and foreign matters on the back surface of the semiconductor substrate 1 which have been generated during grinding (Step 204 of FIG. 17).

Figure 19:
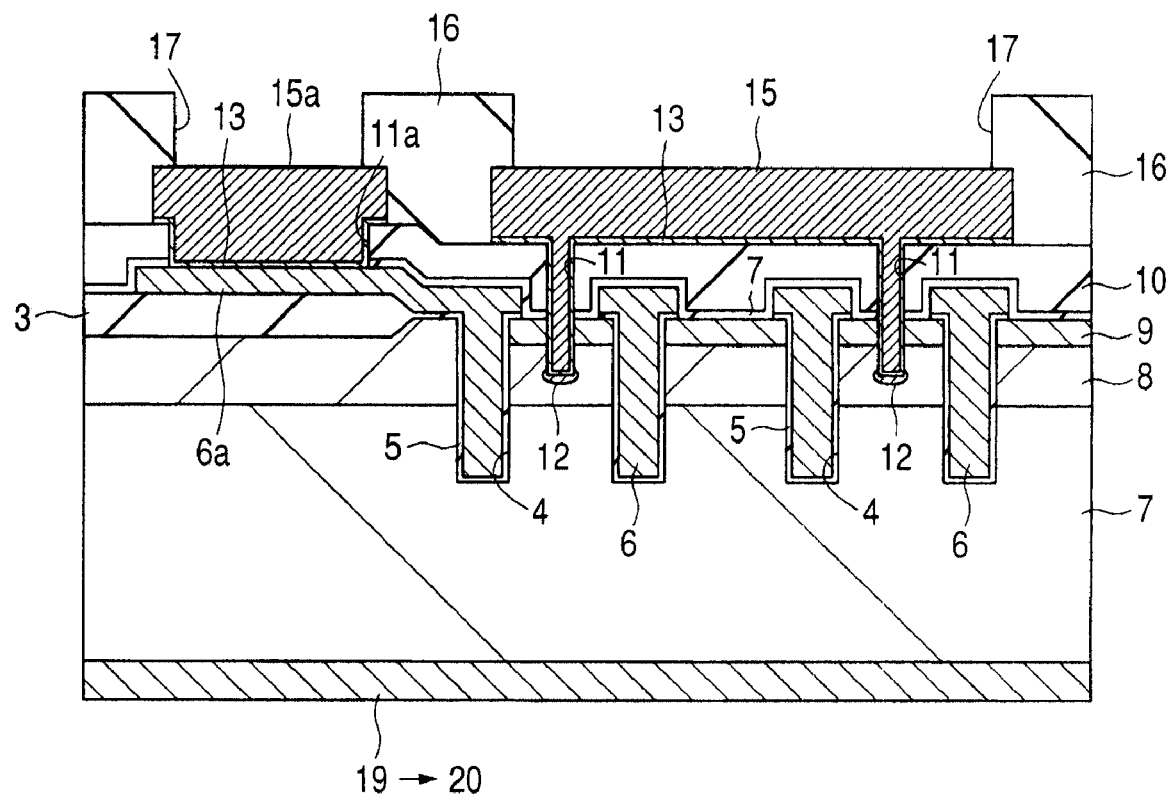
FIG. 19 is a fragmentary cross-sectional view of the semiconductor device during a manufacturing step following that of FIG. 18.

As illustrated in FIG. 19, n type impurity (first impurity, for example, phosphorus) ions are implanted into the semiconductor substrate 1 from the back surface thereof as in Embodiment 1 to form an n type ion implantation region 19 is formed on the back surface side of the semiconductor substrate 1 (Step 205 of FIG. 17). Ion implantation is performed under similar conditions to those employed in Step 106 of Embodiment 1.

An $n^+$ type semiconductor region 20 is then formed by irradiating laser to the semiconductor substrate 1 from the back surface thereof to activate the n type impurity ions implanted in the back surface of the semiconductor substrate 1 (Step 206 of FIG. 17). Laser irradiation conditions are, for example, similar to those employed in Step 107 of Embodiment 1. By this laser irradiation, a field stop layer ($n^+$ type semiconductor region 20) having an activation ratio of n type impurity ions of 60% or greater is formed. Since the semiconductor substrate 1 is made thicker than 120 μm, it is possible to prevent cracking of the semiconductor substrate 1 during ion implantation.

Figure 20:
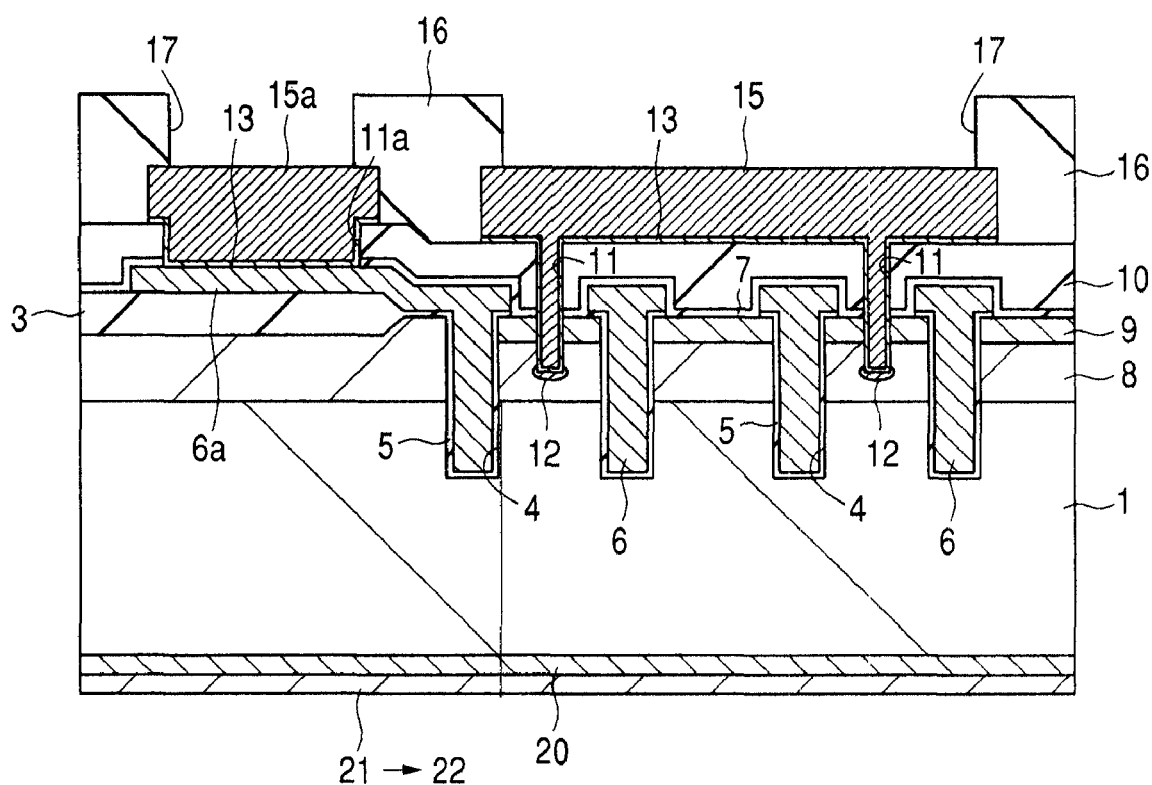
FIG. 20 is a fragmentary cross-sectional view of the semiconductor device during a manufacturing step following that of FIG. 19.

As illustrated in FIG. 20, p type impurity (second impurity, for example, boron) ions are implanted into a region shallower than the $n^+$ type semiconductor region 20 on the back surface of the semiconductor substrate 1 as in Embodiment 1 to form a p type ion implantation region 21 (Step 207 of FIG. 17). Ion implantation is performed under similar conditions to those employed in Step 108 of Embodiment 1.

The semiconductor substrate 1 is then subjected to low-temperature heat treatment to activate the p type impurity ions implanted into the back surface of the semiconductor substrate 1 and form a $p^+$ type semiconductor region 22 (Step 208 of FIG. 17), whereby a collector region ($p^+$ type semiconductor region 22) having an activation ratio of p type impurity ions from 1 to 15% is formed. Unlike Embodiment 1, Embodiment 2 is free from the problem of deterioration in an adhesive which will otherwise occur when a reinforcing plate is attached to the surface side of the semiconductor substrate 1. Defects generated by the ion implantation can therefore be left in the collector region by employing low-temperature heat treatment instead of laser annealing. In this case, heat treatment temperature is set, for example, at from 400 to 450° C. in order to attain the activation ratio of p type impurity ions from 1 to 15%. For example, when boron ions are implanted at an energy of 40 keV and a dose of $10^{15}$ ions/cm$^2$, followed by heat treatment at 420° C. for 1 hour, the activation ratio of boron ions is about 2%. For the heat treatment, furnace annealing is, for example, employed. Batch treatment in which a plurality of semiconductor substrates 1 can be heat treated simultaneously can be performed in furnace annealing. For example, by putting a plurality of semiconductor substrates 1, which have been placed on a stage, into a quartz tube and heating an electric furnace with a cylindrical heater which is disposed at the periphery of the quartz tube and has a resistance wire wound therearound, a plurality of the semiconductor substrates 1 can be heated simultaneously. This furnace annealing requires only a shorter treatment time than laser annealing in which semiconductor substrates are treated one by one.

The $p^+$ type semiconductor region 22 may be formed by irradiating laser from the back surface side of the semiconductor substrate 1 to activate p type impurity ions implanted into the back surface of the semiconductor substrate 1. Laser may be irradiated, for example, under similar conditions to those employed in Step 109 of Embodiment 1.

By the steps so far described, the base region (semiconductor substrate 1) having a thickness of from about 120 to 200 μm, the field stop layer ($n^+$ type semiconductor region 20) having a thickness of from about 1 to 1.5 μm and an activation ratio of n type impurity ions of 60% or greater, and the collector region ($p^+$ type semiconductor region 22) having a thickness of from about 0.1 to 0.5 μm and an activation ratio of p type impurity ions from 1 to 15% are formed on the back surface side of the semiconductor substrate 1.

Figure 21:
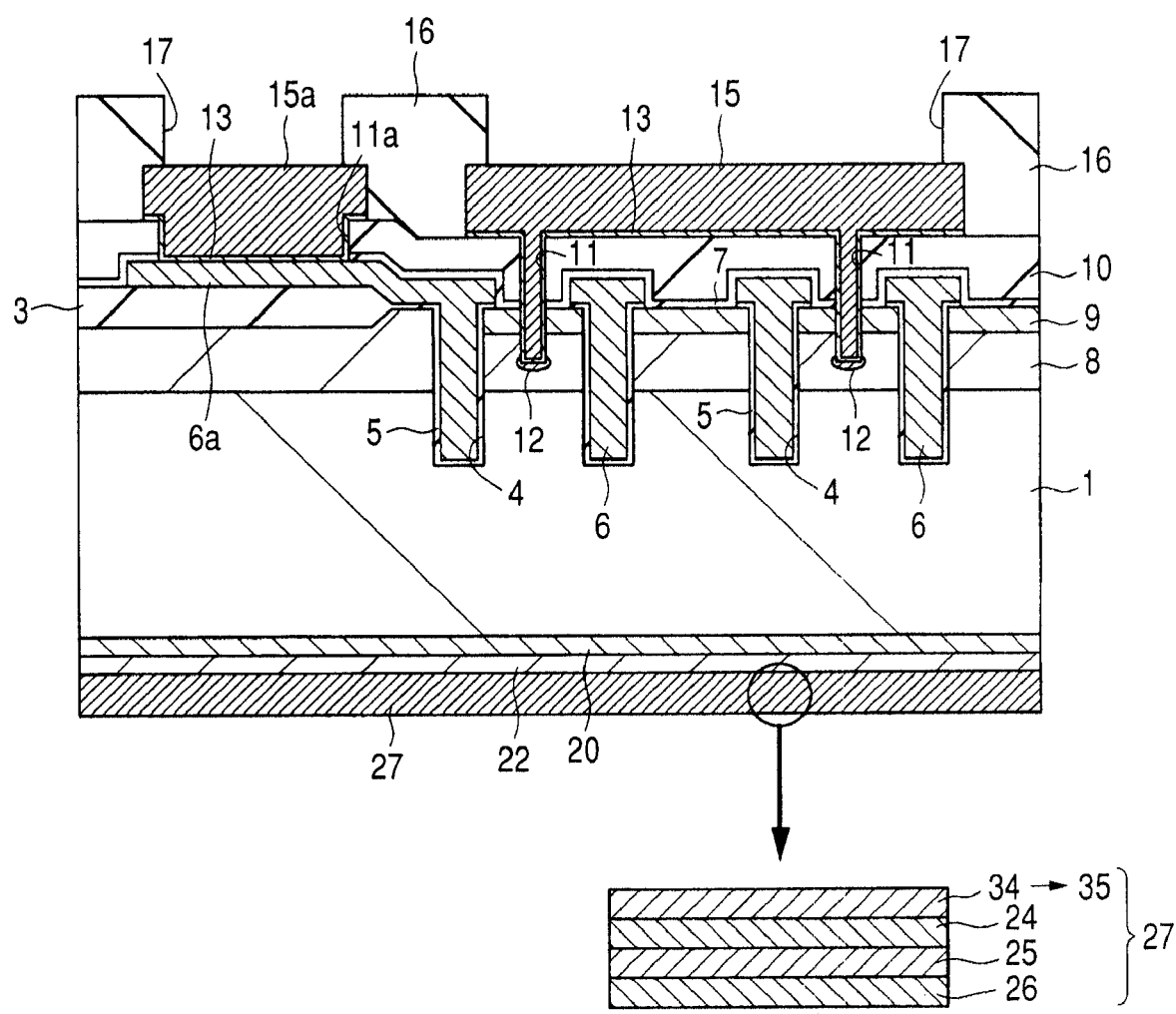
FIG. 21 is a fragmentary cross-sectional view of the semiconductor device during a manufacturing step following that of FIG. 20.

As illustrated in FIG. 21, after washing the surface and back surface of the semiconductor substrate 1 with hydrofluoric acid, a nickel film 34, a titanium film 24, a nickel film 25 and a gold film 26, for example, are formed successively by sputtering or vacuum deposition to form, on the back surface of the semiconductor substrate 1, a film stack of these films (Step 209 of FIG. 17) as a conductive film. The thicknesses of the nickel film 34, the titanium film 24, the nickel film 25, and the gold film 26 are, for example, about 0.05 μm, 0.1 μm, 0.6 μm and 0.1 μm, respectively. Alloy treatment is then performed by low-temperature heat treatment to cause a reaction between the nickel film 34 and the semiconductor substrate (single crystal silicon) 1, thereby forming a compound (nickel silicide (NiSi) film 35) to provide an ohmic contact (Step 210 of FIG. 17). The above-described heat treatment is, for example, furnace annealing. Unlike Embodiment 1, the semiconductor substrate 1 has no reinforcing plate on the surface side thereof and it is free from the problem of deterioration in an adhesive of the reinforcing plate so that low-temperature heat treatment can be employed. The above-described film stack constitutes a collector electrode 27 serving as an extraction electrode of the collector region.

The collector electrode may be formed as in Embodiment 1. Described specifically, after formation of a nickel silicide film 23 by reacting a nickel film and semiconductor substrate 1 by laser annealing, a titanium film 24, a nickel film 25 and a gold film 26, for example, are formed successively over the nickel silicide film 23 by sputtering or vacuum deposition to form a collector electrode made of a film stack of these films (Steps 110 to 112 of Embodiment 1).

By steps similar to those employed in Embodiment 1, an emitter electrode, bump electrode and the like are then formed, whereby the fabrication of the IGBT is completed.

Thus, by adjusting the activation ratio of n type impurity ions in the field stop layer ($n^+$ type semiconductor region 20) to 60% or greater and the activation ratio of p type impurity ions in the collector region ($p^+$ type semiconductor region 22) to from 1 to 15% as in Embodiment 1, an IGBT having high breakdown voltage and high-speed switching characteristics is available by Embodiment 2. In addition, corrosion of the collector electrode can be prevented by using the film stack of the nickel silicide film 35, titanium film 24, nickel film 25 and gold film 26 for the collector electrode.

When the semiconductor substrate 1 is thicker than 120 μm, grinding and wet etching of the back surface of the semiconductor substrate 1 can be carried out without using a reinforcing plate so that low-temperature heat treatment can be employed in the activation step (Step 208) of p type impurity ions for the formation of the collector region ($p^+$ type semiconductor region 22) having an ion activation ratio as low as from 1 to 15% and the alloy treatment step (Step 210) for providing an ohmic contact with the collector electrode. Attachment and removal steps of the reinforcing plate can therefore be omitted, resulting in a better through-put than that of Embodiment 1.

Inventions made by the present inventors were described based on some embodiments. It should be borne in mind, however, that the present invention is not limited to or by them but can be modified variously without departing from the scope of the invention.

The semiconductor device according to the present invention can be applied to, for example, motor driver modules mounted on automobiles.

What is claimed is:

1. A method of manufacturing a semiconductor device, comprising the steps of:
    (a) forming a semiconductor element and interconnect on the side of a first surface of a semiconductor substrate of a first conductivity type;
    (b) after covering the semiconductor element and interconnect with a protective film, attaching a reinforcing plate over the protective film;
    (c) after the step (b), implanting first impurity ions from the side of a second surface which is on the side opposite to the first surface of the semiconductor substrate;
    (d) after the step (c), first laser irradiating a region into which the first impurity ions have been implanted to form a first semiconductor region of the first conductivity type having an activation ratio of the first impurity ions of 60% or greater and having an impurity concentration greater than an impurity concentration of the semiconductor substrate, such that the first laser irradiating is performed using a first wavelength and a first energy density;
    (e) after the step (d), implanting, from the second surface side of the semiconductor substrate, second impurity ions into a region shallower than the region into which the first impurity ions have been implanted;
    (f) after the step (e), second laser irradiating a region into which the second impurity ions have been implanted to form a second semiconductor region of a second conductivity type which is different from the first conductivity type and which has an activation ratio of the second impurity ions from 1 to 15%, such that the second laser irradiating is performed using the first wavelength and a second energy density lower than the first energy density; and
    (g) after the step (f), peeling off the reinforcing plate from the first surface of the semiconductor substrate.

2. The method of manufacturing a semiconductor device according to claim 1, further comprising, between the steps (b) and (c), a step of:
    (h) grinding the semiconductor substrate from the second surface to adjust the thickness of the semiconductor substrate from 70 to 120 µm.

3. The method of manufacturing a semiconductor device according to claim 1, wherein the first impurity ions are phosphorus ions and the second impurity ions are boron ions.

4. The method of manufacturing a semiconductor device according to claim 1, wherein the reinforcing plate is a quartz glass or ceramic plate.

5. The method of manufacturing a semiconductor device according to claim 1, further comprising between the steps (f) and (g), the steps of:
    (i) after step (f), depositing a nickel film over the second surface of the semiconductor substrate;
    (j) irradiating laser to cause reaction between the nickel film and the semiconductor substrate to form a nickel silicide film contiguous to the second semiconductor region; and
    (k) before the step (g), forming a titanium film, a nickel film and a gold film over the nickel silicide film.

6. The method of manufacturing a semiconductor device according to claim 1, wherein the semiconductor substrate comprises FZ single-crystal silicon.

7. The method of manufacturing a semiconductor device according to claim 1, wherein the impurity concentration of the first semiconductor region is higher than the impurity concentration of the semiconductor substrate.

8. The method of manufacturing a semiconductor device according to claim 1, wherein the first semiconductor region has a thickness of from 1 to 1.5 µm.

9. The method of manufacturing a semiconductor device according to claim 1, wherein the second semiconductor region has a thickness of from 0.1 to 0.5 µm.

10. The method of manufacturing a semiconductor device according to claim 2, further comprising, after the step (h), a step of:
    (l) wet etching the second surface of the semiconductor substrate.

11. A method of manufacturing a semiconductor device, comprising the steps of:
    (a) forming a semiconductor element and interconnect on the side of a first surface of semiconductor substrate of a first conductivity type;
    (b) covering the semiconductor element and interconnect with a protective film;
    (c) after the step (b), implanting first impurity ions from the side of a second surface which is on the side opposite to the first surface of the semiconductor substrate;
    (d) after the step (c), first laser irradiating a region into which the first impurity ions have been implanted to form a first semiconductor region of the first conductivity type having an activation ratio of the first impurity ions of 60% or greater and having an impurity concentration greater than an impurity concentration of the semiconductor substrate such that the first laser irradiating is performed using a first wavelength and a first energy density;
    (e) after the step (d), implanting, from the second surface side of the semiconductor substrate, second impurity ions into a region shallower than the region into which the first impurity ions have been implanted; and
    (f) after the step (e), heat treating the semiconductor substrate with second laser irradiating to form a second semiconductor region of a second conductivity type which is different from the first conductivity type and which has an activation ratio of the second impurity ions from 1 to 15% such that the second laser irradiating is performed using the first wavelength and a second energy density lower than the first energy density.

12. The method of manufacturing a semiconductor device according to claim 11, further comprising, between the steps (b) and (c), a step of:
    (g) grinding the semiconductor substrate from the second surface to adjust the thickness of the semiconductor substrate from 120 to 200 µm.

13. The method of manufacturing a semiconductor device according to claim 11, wherein the first impurity ions are phosphorus ions and the second impurity ions are boron ions.

14. The method of manufacturing a semiconductor device according to claim 11, wherein the heat treatment in the step (f) is carried out at from 400 to 450° C.

15. The method of manufacturing a semiconductor device according to claim 11, wherein the heat treatment in the step (f) is furnace annealing.

16. The method of manufacturing a semiconductor device according to claim 11, further comprising, after the step (f), the steps of:

(h) successively forming a first nickel film, a titanium film, a second nickel film and a gold film over the second surface of the semiconductor substrate; and (i) heat treating the semiconductor substrate to cause a reaction between the first nickel film and the semiconductor substrate to form a nickel silicide film contiguous to the second semiconductor region.

17. The method of manufacturing a semiconductor device according to claim 11, wherein the semiconductor substrate comprises FZ single-crystal silicon.

18. The method of manufacturing a semiconductor device according to claim 11, wherein the impurity concentration of the first semiconductor region is higher than impurity concentration of the semiconductor substrate.

19. The method of manufacturing a semiconductor device according to claim 11, wherein the first semiconductor region has a thickness of from 1 to 1.5 µm.

20. The method of manufacturing a semiconductor device according to claim 11, wherein the second semiconductor region has a thickness of from 0.1 to 0.5 µm.

21. The method of manufacturing a semiconductor device according to claim 13, further comprising, after the step (g), a step of:

(j) wet etching the second surface of the semiconductor substrate.

22. The method of manufacturing a semiconductor device according to claim 1, wherein the semiconductor substrate and the second semiconductor region serve as a base region and a collector region of the semiconductor element, respectively, wherein the second semiconductor region functions to suppress spreading of a depletion layer from the base region toward the collector region.

23. The method of manufacturing a semiconductor device according to claim 22, wherein the semiconductor element is a bipolar transistor.

24. The method of manufacturing a semiconductor device according to claim 11, wherein the semiconductor substrate and the second semiconductor region serve as a base region and a collector region of the semiconductor element, respectively, wherein the second semiconductor region functions to suppress spreading of a depletion layer from the base region toward the collector region.

25. The method of manufacturing a semiconductor device according to claim 24, wherein the semiconductor element is a bipolar transistor.

26. The method of manufacturing a semiconductor device according to claim 1, wherein the first wavelength is 527 nm.

27. The method of manufacturing a semiconductor device according to claim 1, wherein, in the step (d), laser irradiating is performed using a first delay time, wherein, in the step (f), laser irradiating is performed using a second delay time shorter than the first delay time.

28. The method of manufacturing a semiconductor device according to claim 11, wherein the first wavelength is 527 nm.

29. The method of manufacturing a semiconductor device according to claim 11, wherein, in the step (d), laser irradiating is performed using a first delay time, wherein, in the step (f), laser irradiating is performed using a second delay time shorter than the first delay time.

* * * * *